(12) United States Patent
Kuhn et al.

(10) Patent No.: US 8,189,123 B2
(45) Date of Patent: May 29, 2012

(54) PROJECTION APPARATUS

(75) Inventors: Gerhard Kuhn, Köfering (DE); Moritz Engl, Regensburg (DE); Patrick Kromotis, Regensburg (DE); Stefan Grötsch, Bad Abbach (DE); Josef Hüttner, Regensburg (DE); Mario Wanninger, Regensburg (DE); Georg Bogner, Lappersdorf (DE)

(73) Assignee: Osram Opto Semiconductors GmbH, Regensburg (DE)

(*) Notice: Subject to any disclaimer, the term of this patent is extended or adjusted under 35 U.S.C. 154(b) by 1030 days.

(21) Appl. No.: 11/914,020

(22) PCT Filed: Apr. 21, 2006

(86) PCT No.: PCT/DE2006/000698
§ 371 (c)(1),
(2), (4) Date: Jan. 17, 2008

(87) PCT Pub. No.: WO2006/119723
PCT Pub. Date: Nov. 16, 2006

(65) Prior Publication Data
US 2008/0192153 A1 Aug. 14, 2008

(30) Foreign Application Priority Data

May 13, 2005 (DE) .......................... 10 2005 022 357
Jul. 5, 2005 (DE) .......................... 10 2005 031 336

(51) Int. Cl.
*H04N 7/24* (2011.01)
(52) U.S. Cl. ...................... 348/744; 348/749; 348/763
(58) Field of Classification Search .................. 348/744, 348/749, 763
See application file for complete search history.

(56) References Cited

U.S. PATENT DOCUMENTS

| 6,483,613 | B1 | 11/2002 | Woodgate et al. |
| 6,616,862 | B2 | 9/2003 | Srivastava et al. |
| 6,670,748 | B2 | 12/2003 | Ellens et al. |
| 7,064,480 | B2 | 6/2006 | Bokor et al. |
| 2004/0062699 | A1 | 4/2004 | Oshio |
| 2004/0120647 | A1 | 6/2004 | Sakata et al. |
| 2004/0264185 | A1 | 12/2004 | Grotsch et al. |
| 2006/0232969 | A1 | 10/2006 | Bogner et al. |

FOREIGN PATENT DOCUMENTS

DE 10036940 2/2002

(Continued)

OTHER PUBLICATIONS

English translation of the International Preliminary Report on Patentability of International Application No. PCT/DE2006/000698, mailed Dec. 21, 2007, by Agnes Wittmann-Regis.
International Search Report for PCT/DE2006/000698, dated Jul. 5, 2006.

(Continued)

*Primary Examiner* — Hunter Lonsberry
(74) *Attorney, Agent, or Firm* — Fish & Richardson P.C.

(57) ABSTRACT

A projection apparatus is specified, comprising a light modulator having a light receiving region with a cross-sectional area to be illuminated of the size $A_M$ and a maximum acceptance angle $\alpha$ for incident light, and at least one light source by means of which, during its operation, a light cone is produced for illuminating said cross-sectional area of said light receiving region and which comprises a number N of LED chips having a maximum radiation angle $\beta$. At least one of the LED chips has a radiation decoupling area of the size $A_D$. The relation $0.7 \cdot (A_M \cdot \sin^2(\alpha))/(A_D \cdot \sin^2(\beta) \cdot n^2) \leq N \leq 1.3 \cdot (A_M \cdot \sin^2(\alpha))/(A_D \cdot \sin^2(\beta) \cdot n^2)$ applies, where n is equal to 1 or to the refractive index of a coupling medium with which the LED chips are provided.

26 Claims, 17 Drawing Sheets

FOREIGN PATENT DOCUMENTS

| | | |
|---|---|---|
| DE | 10147040 | 4/2003 |
| DE | 10245892 | 5/2004 |
| JP | 2000-180962 | 6/2000 |
| TW | 200425548 | 11/2004 |
| WO | WO 00/33390 | 6/2000 |
| WO | WO 01/62012 | 8/2001 |
| WO | WO 2004/097516 | 11/2004 |
| WO | WO 2004/097946 | 11/2004 |

OTHER PUBLICATIONS

English translation of the Notification for the Opinion of Examination issued on Oct. 26, 2008 for the corresponding Taiwanese application.

Schnitzer, I. et al., "30% external quantum efficiency from surface textured, thin-film light-emitting diodes", Appl. Phys. Letter, vol. 63:2174-2176 (Oct. 18, 1993).

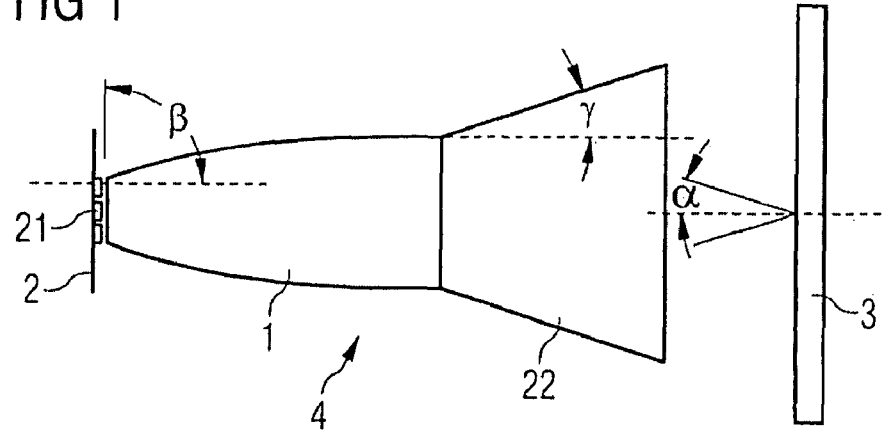
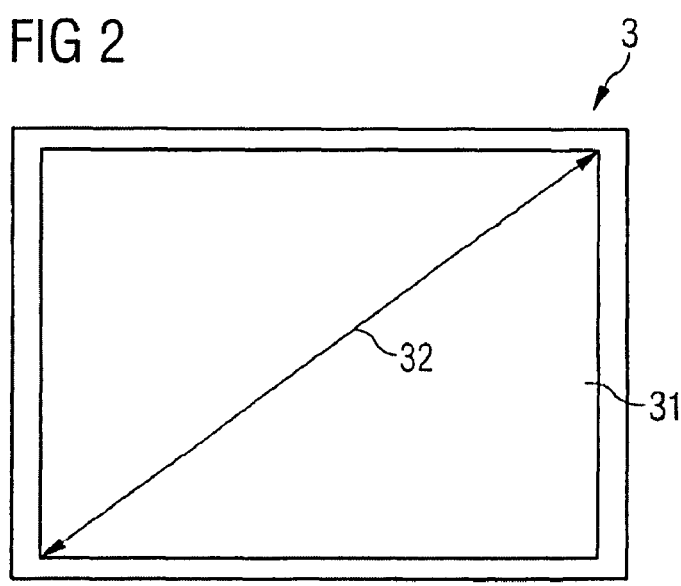
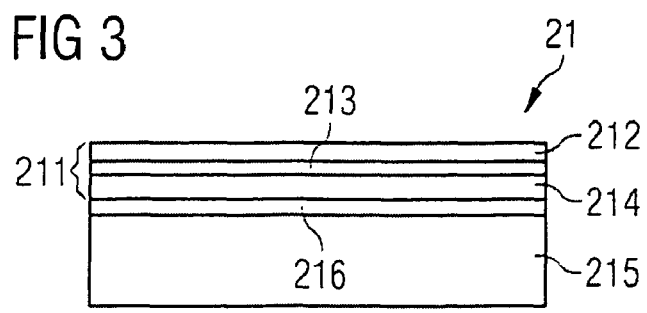

FIG 37
FIG 38
FIG 39
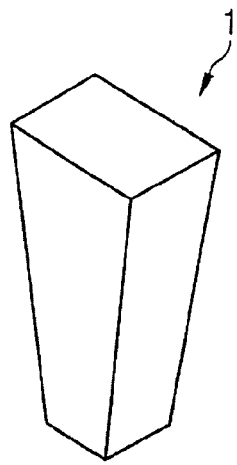
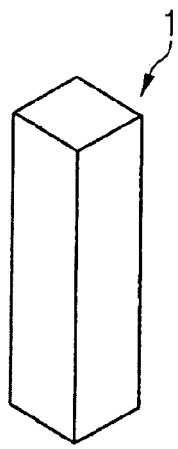
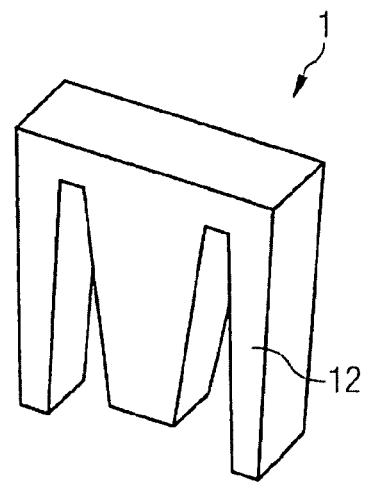
FIG 40
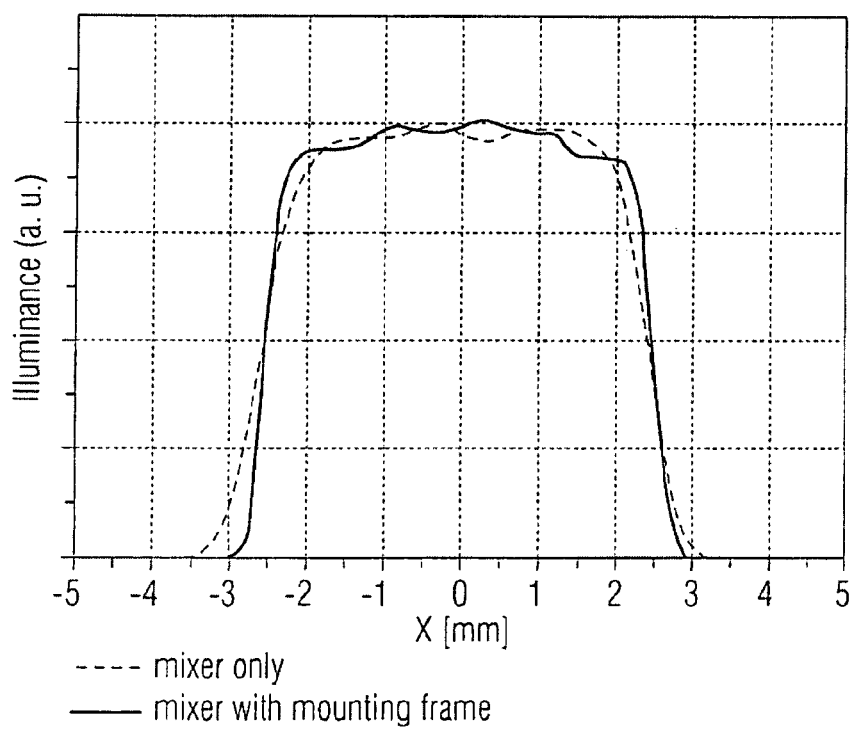

PROJECTION APPARATUS

CROSS-REFERENCE TO RELATED APPLICATIONS

This application is the National Stage of International Application No. PCT/DE2006/000698, filed on Apr. 21, 2006, which claims the priority to German Patent Applications Serial No. 102005022357.5, filed on May 13, 2005 and Serial No. 102005031336.1, filed on Jul. 5, 2005. The contents of all applications are hereby incorporated by reference in their entireties.

FIELD OF THE INVENTION

The present invention concerns a projection apparatus with a light modulator and at least one light source comprising light-emitting diode (LED) chips.

BACKGROUND

The brightness of a projected image is of particular importance in connection with projection apparatuses. To obtain the highest possible brightness, light sources for projection apparatuses of the aforesaid kind have heretofore normally been equipped with the largest possible number of LED chips.

SUMMARY

Disclosed herein are embodiments of projection apparatus of the initially cited kind that has higher efficiency with respect to generating a luminous intensity than conventional projection apparatuses.

The number N of LED chips is chosen with consideration of the properties of the light modulator. Surprisingly, it has been found that optimal efficiency in terms of generating a high luminous intensity in a projection apparatus is possible with only a relatively small number of LED chips, compared to conventional projection apparatuses.

The optimized number N of LED chips is determined with consideration of, inter alia, the size $A_M$ of a cross-sectional area to be illuminated of a light receiving region of the light modulator and a maximum acceptance angle $\alpha$ of said light receiving region for incident light. The maximum acceptance angle $\alpha$ of the light receiving region is the maximum incident angle provided for the light modulator for light incident on said light modulator.

Also considered in determining the number N of LED chips is the size $A_D$ of a radiation decoupling area of the LED chips and a maximum radiation angle $\beta$ of said chips. It is also possible, alternatively, to use the radiation decoupling area $A_D$ and the maximum radiation angle $\beta$ of only one of the LED chips, that is, at least one LED chip has a radiation decoupling area of the size $A_D$. The radiation decoupling area of an LED chip is the external surface through which the electromagnetic radiation is decoupled from the LED chip. The maximum radiation angle $\beta$ is measured in relation to a main radiation direction of the LED chip, and is the angle at which a significant intensity of electromagnetic radiation is still decoupled from the LED chip.

In the projection apparatus, at least one optical element is disposed in a light path between the LED chips and the light modulator.

The number N of LED chips is expressed by:

$$0.7 \cdot (A_M \cdot \sin^2(\alpha))/(A_D \cdot \sin^2(\beta) \cdot n^2) \leq N \leq 1.3 \cdot (A_M \cdot \sin^2(\alpha))/(A_D \cdot \sin^2(\beta) \cdot n^2)$$

where the value of n depends on the extent to which decoupling of radiation from the LED chips is influenced by additional means. In other words, possible values for the number N of LED chips are determined on the basis of the quotient of $(A_M \cdot \sin^2(\alpha))$ and $(A_D \cdot \sin^2(\beta) \cdot n^2)$, and are no more than 30% above or below that quotient. According to a first embodiment, n=1. Alternatively, n is equal to the refractive index of a material of a coupling medium with which the radiation decoupling area of the LED chips is provided, as will be explained in more detail hereinbelow.

According to one embodiment, a gap filled with a gas is present in the light path between the LED chip and the optical element. In addition, the radiation decoupling area $A_D$ of the LED chips is free of coupling medium. In this case, n=1.

A coupling medium is to be understood in connection with the present invention as a medium by means of which the decoupling of radiation from the LED chips is influenced significantly in comparison to bare LED chips. This is particularly the case when the radiation decoupling area $A_D$ of the LED chips is free of capsule material such as a potting compound, for example. A capsule material is to be understood as a material suitable for encapsulating or enveloping LED chips in a manner known per se such that they are protected against external influences.

The LED chips are also free of coupling medium if the radiation decoupling area $A_D$ is provided with a capsule material in such a way that the decoupling of radiation from the LED chips through the capsule material is influenced to only a negligible extent. This is particularly the case if the capsule material has a thickness, on radiation decoupling area $A_D$, that is less than or equal to 0.2 times a maximum distance between mutually opposite chip edges of the LED chips. In LED chips with a square basic shape, the maximum lateral distance is equal to the chip edge length. In LED chips with a rectangular basic shape, the term signifies the length of the longer chip edges. Overall, maximum lateral extent in the sense of the present invention corresponds to the greatest distance between mutually opposite chip edges. In particular, a capsule material that is applied substantially as a planar layer and has a refractive index greater than 1 is not to be understood under the above criteria as a coupling medium in the sense of the present invention. Likewise, air is, in principle, not to be understood as a coupling medium.

According to an alternative embodiment, the radiation decoupling area $A_D$ of the LED chips is provided with a coupling medium. In a projection apparatus according to this embodiment, n is equal to the refractive index of the coupling material.

This is particularly the case if the LED chips are optically coupled to the optical element by means of a coupling material, or if the radiation decoupling area $A_D$ is provided with a coupling material in such a way that the decoupling of radiation from the LED chips is influenced significantly, particularly significantly increased.

In connection with the present invention, it is assumed that such a significant influence on the decoupling of radiation is also brought about when the radiation decoupling area $A_D$ of the LED chips is provided with a coupling material that has a thickness more than 0.2 times the maximum distance between mutually opposite chip edges. The coupling material can also be a capsule material, for example.

The LED chips preferably have a thin-film layer comprising an electromagnetic radiation emitting active region that is substantially free of growth substrate and is provided with a reflector on a side facing away from the main radiation area.

These are essential characteristics of so-called thin-film LED chips, which are particularly preferably contained in the projection apparatus.

A thin-film LED chip is distinguished in particular by the following characteristic features:
- applied to or formed on a first main area, facing a carrier element, of the radiation-generating epitaxial layer sequence is a reflective layer that reflects at least some of the electromagnetic radiation generated in the epitaxial layer sequence back into the latter,
- the epitaxial layer sequence has a thickness in the range of 20 μm or less, particularly preferably in the range of 10 μm or less, and
- the epitaxial layer sequence includes at least one semiconductor layer with at least one surface possessing an intermixing structure that in the ideal case brings about a nearly ergodic distribution of the light in the epitaxial layer sequence, i.e., it has a stochastic scattering behavior that is as ergodic as possible.

A basic principle of a thin-layer LED chip is described, for example, in I. Schnitzer et al., Appl. Phys. Letter. 63 (16), Oct. 18, 1993, 2174-2176, whose disclosure content in this regard is hereby incorporated by reference.

A thin-film LED chip is, as a good approximation, a Lambertian surface radiator, and is therefore particularly well suited for use in the light source for the projection apparatus. A maximum radiation angle $\beta$ of 90° is basically assumed for thin-film LED chips in connection with the present invention. In thin-film LED chips, the fraction of the radiation emitted via the side faces of the thin-film layer is often negligibly small, for example often less than 1% of the total emission, for which reason the fraction of the radiation decoupling area $A_D$ accounted for by these side faces can also be neglected in the case of thin-film LED chips.

According to an advantageous embodiment of the projection apparatus, the LED chips are disposed in a matrix having x-rows and y-columns, possible values for the number x being determined on the basis of the quotient of $(l_M \cdot \sin(\alpha))$ and $(l_D \cdot \sin(\beta) \cdot n)$ and possible values for the number y being determined on the basis of the quotient of $(w^1_M \cdot \sin(\alpha))$ and $(w_D \cdot \sin(\beta) \cdot n)$, and these values being no more than 30% above or below the particular quotient. $l_M$ here denotes a length and $w_M$ a width of the cross-sectional area $A_M$ of the light receiving region of the light modulator, and $l_D$ and $w_D$ respectively denote a length and a width of the main radiation area of the thin-film layer of the LED chips or of one LED chip.

Translator's Note: The German word for "width" starts with a "b" as you will see in the German patent. However, for clarity here, since "Length" is denoted with "l" we have changed the "b" to "w" to denote "width".

By this determination of suitable values for the rows and columns of the matrix, the arrangement of the LED chips can be adapted to the shape of the light receiving region, thus enabling light generated by the LED chips to be used still more effectively.

Possible values for the number N and for the number x or y are particularly preferably equal to the corresponding value of the quotient, rounded up or down to a neighboring whole number. The most efficient possible utilization of the light generated by the LED chips can be achieved in this way.

Alternatively to determining the number N, it is also always possible in the sense of the present invention to predefine a set number N for the LED chips and to adjust the size of the LED chips and their radiation decoupling area $A_D$ or their lengths and widths to a value determined on the basis of the above formula. The radiation decoupling area, for example, is then given by $$0.7 \cdot (A_M \sin^2(\alpha))/(N \cdot \sin^2(\beta) \cdot n^2) \leq A_D \leq 1.3 \cdot (A_M \sin^2(\alpha))/(N \cdot \sin^2(\beta) \cdot n^2)$$

All the other variables in the formula can, of course, be determined correspondingly if the particular remaining variables are predefined.

According to a further advantageous embodiment, possible values for the number N and for the number x or y are equal to the respective quotient, rounded up or down to a neighboring even number. An even number N can be advantageous, for example, if the LED chips are arranged in an even number of groups. In such a case, each group of LED chips is advantageously followed by its own optical element.

According to a particularly advantageous embodiment, a main radiation area of the LED chips has a substantially rectangular shape. In this way, the shape of the LED chips and/or of the radiation decoupling area $A_D$ of the LED chips can be better adapted to the shape or contour of the light receiving region of the light modulator. This, too, is conducive to improving the exploitation of the light emitted by the light source.

A plurality of LED chips is preferably associated collectively with one optical element. This has the advantage, for example, of simplified assembly compared to the case in which each LED chip is associated with its own optical element. Additionally or alternatively, the LED chips are divided into at least two groups, each of which is associated with its own optical element.

At least some of the LED chips usefully are each followed by a luminescence conversion element, by means of which an electromagnetic radiation emitted by the LED chips is at least partially converted into electromagnetic radiation of a modified wavelength. A luminescence conversion element makes it possible in particular to generate white light, for example if a blue-emitting LED chip is combined with a yellow-emitting phosphor.

Alternatively, different LED chips are advantageously followed by different luminescence conversion materials, which preferably emit light of different colors or in different wavelength ranges.

Particularly preferably, each of said luminescence conversion materials comprises a single phosphor. In this way, higher efficiency in the conversion of electromagnetic radiation can be achieved than with the use of a single luminescence conversion material in which several phosphors are mixed together, since when several phosphors are used, light emitted by a first phosphor may be reabsorbed by a second phosphor. On the other hand, a broader emission spectrum can generally be obtained by using phosphors to generate colored light than by using LED chips alone. Overall, light that exhibits improved color reproduction can be obtained with this approach.

The optical element is preferably configured in the manner of a non-imaging optical concentrator, which is provided for radiation to pass through it in the opposite direction from that taken in a conventional use of a concentrator. Through the use of at least one such optical element, the divergence of the light emitted by the light source can advantageously be reduced in an efficient manner.

It is particularly advantageous in this case if a light input of the optical concentrator is positioned as close as possible to the LED chips. The solid angle in which the light is emitted from the optical element is usefully reduced by the optical element as closely as possible to the LED chips, where a cross-sectional area of the beam cone is still small. This is especially necessary when an extremely high radiation intensity is to be projected onto an extremely small area, as is the case with projection apparatuses.

An important conserved quantity in geometrical optics in this connection is the etendue, that is, the optical throughput.

This is the product of the areal content of a light source and the solid angle in which it radiates. Etendue describes the extent of a light cone of arbitrary intensity. The conservation of etendue has the effect, inter alia, that the light from a diffuse radiation source, for example an LED chip, can no longer be concentrated, i.e. can no longer be deflected onto an area of smaller extent, without losses, for which reason it is advantageous if the light bundle has the smallest possible cross section as it enters the optical element.

In a particularly useful embodiment, the light is so strongly collimated by the optical element, that is, the divergence of the light is so greatly reduced, that it is emitted from the optical element in a beam cone having an included angle that is smaller than or equal to the maximum acceptance angle $\alpha$ of the light receiving region of the light modulator.

According to an advantageous embodiment, the included angle of the beam cone is less than or equal to 25°, preferably less than or equal to 20°, particularly preferably less than or equal to 15°.

The optical concentrator is advantageously a CPC-, CEC- or CHC-like optical concentrator, by which is meant, here and hereinafter, a concentrator whose reflecting side walls at least partially and/or at least to the greatest possible extent have the shape of a compound parabolic concentrator (CPC), a compound elliptic concentrator (CEC) and/or a compound hyperbolic concentrator (CHC).

Particularly advantageously, the reflecting surfaces of the optical element are configured partially or completely as freeform surfaces, in order to optimally adjust a desired radiation characteristic. The optical element is then preferably similar in basic shape to a CPC, a CEC or a CHC.

Alternatively, the concentrator advantageously has side walls that connect a radiation input to a radiation output and are configured such that direct connecting lines extending on the side walls run substantially rectilinearly between the radiation input and the radiation output.

In that case, the optical element usefully has a base body that defines a cavity and whose inner wall is reflective of a spectral subregion of the light emitted by the light source.

Alternatively, the optical element is advantageously configured in the manner of a dielectric concentrator and has a base body in the form of a solid body comprising a dielectric material of suitable refractive index, such that light coupled into the optical element is reflected into the surrounding medium by total reflection from lateral boundary surfaces of the solid body. The exploitation of total reflection makes it possible to virtually eliminate absorption of the light as it is reflected.

The optical element advantageously comprises a radiation output having a boundary surface that is curved in a lens-like manner. Further reduction of the divergence of the light can be achieved in this way.

As an alternative to an optical concentrator, the optical element is advantageously configured as a light guide operative to mix light and having a constant cross-sectional area or a cross-sectional area that increases toward the light output. The cross-sectional area of the optical element preferably has the shape of an even-numbered polygon. Its outer surfaces are usefully implemented as straight and comprise flat subareas, thereby ensuring good mixing of the light. Such an implementation of the optical element is especially advantageous if differently colored light that is to be mixed to produce white light is coupled into the optical element.

Alternatively, such a light guide for mixing light is disposed in the beam path after the optical element of the projection apparatus.

Some of the adjacent LED chips or all of the adjacent LEDs are usefully arranged at the smallest possible distance from one another. The distance is preferably less than or equal to 300 µm, particularly preferably less than or equal to 100 µm, and is greater than or equal to 0 µm. This measure is advantageous in achieving the highest possible beam density in the projection apparatus.

The optical element preferably has a substantially rectangular cross section on the side comprising a beam output. In this way, a cross section of the light cone can be shaped in the optical element such that it is at least partially adapted to the cross section of the light receiving region of the light modulator.

Additionally or alternatively, the optical element has a first maximum radiation angle along a first plane and a second maximum radiation angle different from the first maximum radiation angle along a second plane. In other words, the optical element is configured such that light entering through a beam input is emitted along the first plane at the first maximum angle and along the second plane at the second maximum angle. The first and the second plane extend in particular parallel to a main radiation direction of the optical element. The first and the second plane are preferably disposed perpendicularly to each other. This measure, too, may be advantageous in adapting the light cone to the light modulator.

The first maximum radiation angle is preferably between 10° inclusive and 13° inclusive and the second maximum radiation angle is preferably between 13° inclusive and 18° inclusive.

Further advantages, preferred embodiments and improvements of the projection apparatus and its elements will be made apparent by the exemplary embodiment described hereinafter in conjunction with FIGS. 1 to 40.

BRIEF DESCRIPTION OF THE DRAWINGS

FIG. 1 shows a schematic structure of the projection apparatus according to one exemplary embodiment in sectional view, FIG. 2 shows the light modulator of the projection apparatus depicted in FIG. 1 in a schematic plan view of its light receiving region, FIG. 3 is a schematic sectional view of an LED chip, FIG. 37 is a schematic perspective representation of the optical element according to an eighteenth exemplary embodiment, FIG. 38 is a schematic perspective representation of the optical element according to a nineteenth exemplary embodiment, FIG. 39 is a schematic perspective representation of the optical element according to a twentieth exemplary embodiment, FIG. 40 is a plot of light intensity as a function of distance from the optical axis, measured in a beam path behind the optical element depicted in FIG. 39 and behind the optical element depicted in FIG. 37.

Figure 4:
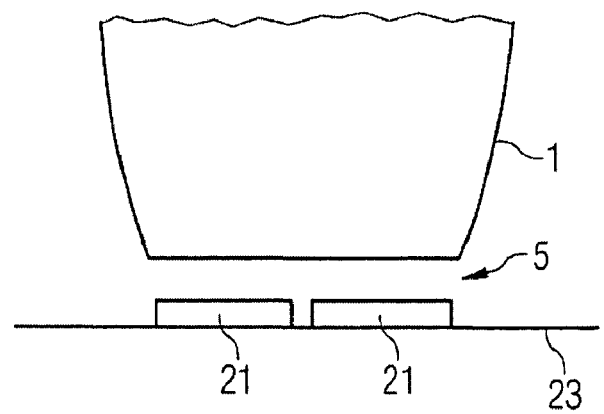
FIG. 4 is a schematic sectional view of the light source and a portion of the optical element according to a first exemplary embodiment.

In the exemplary embodiments and figures, like or like-acting elements are provided with the same respective reference characters. The illustrated elements in the figures are not necessarily to be considered true to scale, but may in part be depicted as exaggeratedly large for purposes of better understanding.

The projection apparatus illustrated in FIG. 1 includes a light source 2, an optical element 1 and a light modulator 3. The projection apparatus 4 can, of course, comprise various other elements as well, but these have been omitted from the description of the exemplary embodiment for the sake of simplicity.

The light source 2, the optical element 1 and the light modulator are arranged along a beam path of the projection apparatus 4, which beam path need not extend linearly, but may, for example, by deflected as desired by means of deflecting elements and/or divided one or more times by means of beam splitters.

The light source 2 comprises plural LED chips 21, it being possible alternatively to use a single LED chip 21 having a radiation decoupling area commensurate in size with that of the plurality of LED chips combined. The LED chips have a maximum radiation angle β, said maximum radiation angle β preferably being that angle at which at least 0.5% of the radiation output emitted by the LED chip 21 in a main radiation direction thereof is still emitted. The LED chips are, for example, thin-film LED chips, which as a good approximation have a maximum radiation angle β of 90°.

FIG. 3 is a schematic sectional view of a thin-film LED chip. It comprises a thin-film layer 211 having a thickness of, for example, less than or equal to 20 µm, for example of 9 µm.

On a main face, said thin-film layer 211 is provided over substantially its entire area with a reflector 216. The thin-film layer 211 is applied to a carrier element 215 in such a way that the reflector 216 faces toward and for example is adjacent to the carrier element 215. The carrier element 215 is, for example, a carrier substrate. Alternatively, it is also possible for the carrier element 215 not to be part of the LED chip 21 at all, but for the thin-film layer 211 to be applied, by the side on which the reflector 216 is disposed, directly to a chip mounting surface, for example a chip housing or another chip carrier.

The thin-film layer includes a semiconductor layer sequence, for example comprising an n-conductively doped region 212, an active region 213 that emits electromagnetic radiation, and a p-conductively doped region 214.

In the case of a thin-film LED chip, the radiation intensity emitted at radiation angles of more than 90° is, in principle, of negligible magnitude in the sense of the present invention.

The light modulator 3 has a light receiving region 31 (see FIG. 2). This is, for example, a micromirror chip with a multiplicity of micromirrors that can be tilted mutually independently about at least one axis, such that individual pixels of an image to be projected can, for example, be switched to light or dark by tilting the mirrors. The light receiving region is defined by the micromirrors, i.e., its outer contour extends along the outer edges of the micromirrors disposed on the micromirror chip.

As an alternative to a micromirror chip, the light modulator 3 can also, for example, be a micro liquid crystal display (micro LCD display), in which the light is modulated by the activation and deactivation of filters instead of the tilting of small mirrors. A further option is to use a so-called LCOS (liquid crystal on silicon) device for the light modulator.

The light receiving region 31 has, for example, a rectangular cross-sectional area to be illuminated, which can also, however, be shaped as square or in any other manner. The rectangular cross-sectional area of the light receiving region 31 has a diagonal 32 that is, for example, 0.5 inch or 0.8 inch in size, 1 inch being equal to 25.4 mm. The ratio of the width to the length of the cross-sectional area to be illuminated is, for example, 3:4 or 9:16.

The light receiving region 31 of the light modulator 3 has a maximum acceptance angle $\alpha$ (see FIG. 1). In the case of a micromirror chip, this angle is, for example, the angle by which the micromirror can be tilted maximally out of a flat position. That angle is, for example, ±12°, ±14.5° or ±15°. Possible values for the maximum acceptance angle are, for example, within a range of between 10° inclusive and 20° inclusive.

Light striking the light receiving region 31 at an angle greater than the maximum acceptance angle $\alpha$ cannot be modulated, or cannot be modulated in an intended manner. It is therefore important for the divergence of a light cone 22 emitted by the light source 2 to be reduced as much as possible by the optical element, so that at least most of the light strikes the light receiving region 31 of the light modulator 3 at an angle that is smaller than the maximum acceptance angle $\alpha$. For example, the light cone 22 leaves the optical element 1 at a maximum angle $\gamma$ of less than or equal to 20°. Angle $\gamma$ is equal to 12°, for example.

The number N of LED chips 21 is expressed by:

$$0.7 \cdot (A_M \cdot \sin^2(\alpha))/(A_D \cdot \sin^2(\beta) \cdot n^2) \leq N \leq 1.3 \cdot (A_M \cdot \sin^2(\alpha))/(A_D \cdot \sin^2(\beta) \cdot n^2)$$

If LED chips 21 of a specific size are to be used for the light source 2, then this relation can be used to determine possible values for the number N of LED chips with which the radiation emitted by the LED chips can be utilized most efficiently. Alternatively, it is also possible to fix the number N of LED chips 21 in advance and to use the above relation to determine possible dimensions for the LED chips or possible sizes for the radiation decoupling area of the LED chips 21.

The value used for n in the above relation depends on the extent to which the decoupling of radiation from the LED chips is influenced by corresponding means.

If there is a gap in the light path between the LED chips and the optical element and if the radiation decoupling area $A_D$ of the LED chips is free of coupling medium, then n=1. An example of this is illustrated in FIG. 4, in which the LED chips 21, particularly their radiation decoupling areas, are substantially free of capsule material or coupling material.

A capsule material or coupling material is to be understood, for example, as a dielectric material that is transparent to the radiation emitted by the LED chips 21 and has a refractive index which preferably matches that of a semiconductor material of the LED chips 21, such that Fresnel losses and total reflection at the interface between the semiconductor material and the surrounding medium are significantly reduced.

Fresnel losses are losses due to reflections at interfaces at which there is a refractive index step. A typical example is the refractive index step between air and a dielectric material, for example as electromagnetic radiation passes into or out of an optical element.

Between the LED chips 21 and the optical element 1 there is a gap 5, for example an air gap. Alternatively, the gap 5 can also be filled with another gas, and it is likewise possible for a vacuum to prevail in the gap 5.

Figure 5:
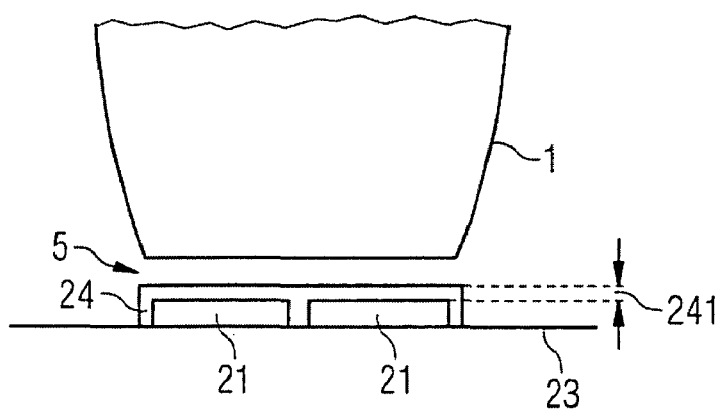
FIG. 5 is a schematic sectional view of the light source and a portion of the optical element according to a second exemplary embodiment.

In the structure depicted in FIG. 5, there is also an air gap 5 between the optical element 1 and the LED chips 21. In contrast to the LED chips 21 depicted in FIG. 4, however, those illustrated in FIG. 5 are provided with a capsule material 24; in particular, they are completely encapsulated in the capsule material 24 and are thereby protected against external influences, such as moisture, for example. However, this capsule material 24 does not constitute a coupling medium in the sense of the present invention as long as it has a thickness 241, over a main radiation area of the LED chips 21, that is less than or equal to 0.2 times a maximum lateral extent of the LED chips.

In the case of rectangular LED chips, the longer of the two horizontal chip edge lengths is the lateral extent of the LED chips. In general, the maximum distance between mutually opposite, horizontally extending edges of the LED chips is to be selected as the maximum lateral extent of the chips.

In the case of square LED chips having a horizontal chip edge length of 1 mm, for example, the capsule material 24 is not to be understood as a coupling medium in the sense of the present application as long as the capsule material 24 covers the LED chips, particularly their radiation decoupling areas, in a substantially planar manner. It is particularly advantageous if the capsule material 24 is made as thin as possible, which is the case in particular if the thickness 241 is less than or equal 200 μm. Under such conditions, the capsule material 24 is not a coupling medium in the sense of the present invention.

Conversely, if the thickness is more than 200 μm, then the capsule material 24 is to be considered a coupling medium, which has the consequence that the value of n is to be set equal to the refractive index of the capsule material 24.

Figure 6:
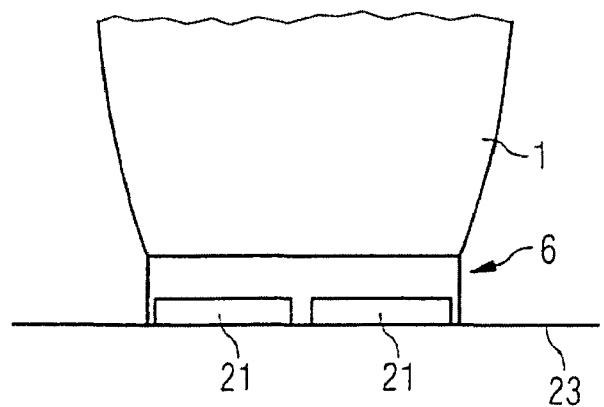
FIG. 6 is a schematic sectional view of the light source and a portion of the optical element according to a third exemplary embodiment.
Figure 7:
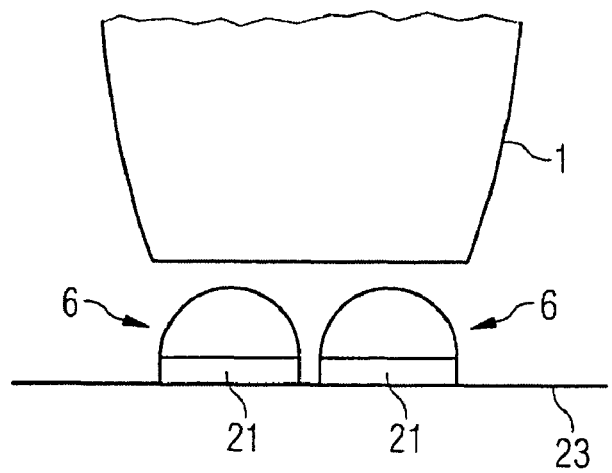
FIG. 7 is a schematic sectional view of the light source and a portion of the optical element according to a fourth exemplary embodiment.
Figure 8:
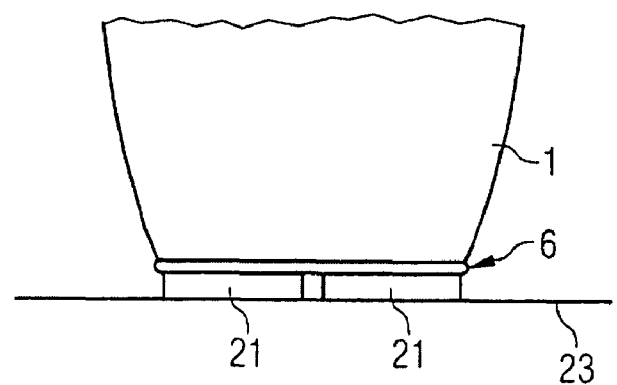
FIG. 8 is a schematic sectional view of the light source and a portion of the optical element according to a fifth exemplary embodiment.
Figure 9:
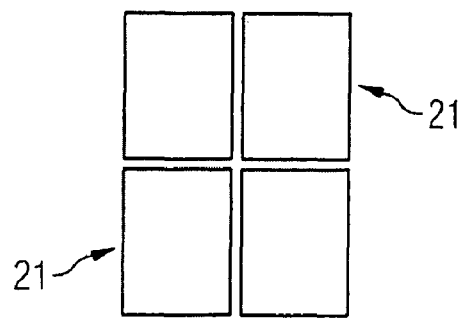
FIG. 9 is a schematic plan view of an arrangement of LED chips of the light source according to a first exemplary embodiment.

Further examples of coupling media 6 are illustrated in FIGS. 6 to 8. In the exemplary embodiment depicted in FIG. 6, the coupling medium consists, for example, of a coupling material by means of which the LED chips 21 are optically coupled to a dielectric base body of the optical element 1. The coupling material is, for example, a radiation-transparent gel with a refractive index which either is matched to the refractive index of the dielectric body of the optical element 1 or the refractive index of a semiconductor material of the LED chips 21, or falls between the refractive indices of those two materials. Alternatively to a gel, an epoxy resin or a varnish-like material, for example, can also be used.

The refractive index of the coupling material 6 preferably falls between that of the dielectric body of the optical element 1 and that of a semiconductor material of the LED chips 21. It is essential that the refractive index be significantly greater than 1. For example, the coupling material used for the coupling medium is one whose refractive index is greater than 1.3, preferably greater than 1.4. Silicone, for example, is one candidate for this purpose. However, other substances, such as liquids, for example, can also be used as the coupling medium. Water, for example, has a refractive index of more than about 1.3 and is, in principle, suitable for use as a coupling medium.

In the exemplary embodiment depicted in FIG. 7, the coupling medium 6 consists of coupling elements that are formed over the LED chips 21. For example, the main radiation areas of the LED chips 21 are provided with lens-like elements, which are, for example, formed from an epoxy resin or from a silicone-containing material and which serve to increase the decoupling of radiation from the LED chips 21 and the incoupling of electromagnetic radiation into the optical element 1.

The lens-like elements depicted in FIG. 6 function similarly to the coupling material illustrated in FIG. 6 in terms of influencing the etendue of the radiation cone emitted by the LED chips. The lens-like elements constitute for the LED chips 21 a non-plane or uneven covering that increases the etendue of the LED chips 21. The increase in etendue is approximately equal to the square of the refractive index of the lens-like elements. The effect of the lens-like elements is comparable, in this regard, to that of the coupling material described hereinabove with reference to FIG. 6. One difference, however, is that when uneven coverings are used, such as those illustrated for example in FIG. 7, additional Fresnel losses occur as the radiation exits the uneven covering and as the radiation enters the optical element.

In the exemplary embodiment depicted in FIG. 8, the coupling medium 6 consists of a thin layer of glue, by means of which the LED chips 21 are directly affixed to a light input of the optical element 1 and are optically coupled to the optical element 1 in a similar manner to the exemplary embodiment described hereinabove with reference to FIG. 6.

$$0.7 \cdot (A_M \cdot \sin^2(\alpha))/(A_D \cdot \sin^2(\beta) \cdot n^2) \leq N \leq 1.3 \cdot (A_M \cdot \sin^2(\alpha))/(A_D \cdot \sin^2(\beta) \cdot n^2)$$

The following table gives exemplary determinations of the numbers N, x and y. The light receiving region has a maximum acceptance angle $\alpha$ of 12° in each case. Thin-film LED chips with a maximum emission angle $\beta$ of 90° and a square shape with a chip edge length of 1 mm are used. The LED chips are free of coupling medium and an air gap is present between the LED chips and the optical element, hence n=1.

The thin-film layer has a thickness of 10 μm, so its lateral faces constitute an area of 0.04 mm². Less than 1% of the total radiation is emitted from the LED chip through these lateral faces, however, for which reason they can be neglected, especially in the present examples. The radiation decoupling area $A_D$ is therefore set at 1.0 mm² in these examples. The lateral faces of the thin-film layer could alternatively be taken into account, in which case $A_D$ would equal 1.04 mm² in the example. Neglecting the lateral faces is preferred, however. "Qu. N" stands for the quotient $(A_M \cdot \sin^2(\alpha))/(A_D \cdot \sin^2(\beta) \cdot n^2)$, "Qu. x" stands for the quotient $(l_M \cdot \sin(\alpha))/(l_D \cdot \sin(\beta) \cdot n^2)$ and "Qu. y" stands for the quotient $(w_M \cdot \sin(\alpha))/(w_D \cdot \sin(\beta) \cdot n)$.

| | $l_M$ [mm] | $w_M$ [mm] | Qu. N | Qu. X | Qu. y | N | x | y |
|---|---|---|---|---|---|---|---|---|
| 1. | 10.16 | 7.62 | 3.35 | 1.58 | 2.11 | 4 | 2 | 2 |
| 2. | 11.10 | 6.23 | 2.98 | 1.29 | 2.3 | 3 | 1 | 3 |
| 3. | 16.26 | 12.19 | 8.57 | 2.53 | 3.38 | 9 | 3 | 3 |
| 4. | 16.26 | 12.19 | 8.57 | 2.53 | 3.38 | 6 | 2 | 3 |
| 5. | 17.71 | 9.96 | 7.63 | 2.07 | 3.68 | 6 | 2 | 3 |
| 6. | 17.71 | 9.96 | 7.63 | 2.07 | 3.68 | 8 | 2 | 4 |

Examples 1 and 2 relate to a 0.5-inch light modulator, i.e., the cross section of the light receiving region measures 0.5 inch on the diagonal, an inch being equal to 25.4 mm. In Example 1, the width and length of the cross section of the light receiving region are in a ratio of 3:4, and in Example 2 a ratio of 9:16. Surprisingly, the possible range of values obtained for the number N of LED chips in Example 1 is only 3.22±30%; taking the lengths and widths into account, 4 is a reasonable value for the number N, and x and y are each usefully selected as equal to 2, i.e., a two-by-two matrix of LED chips would, as an example, be efficient in the sense of the present invention.

In Example 2, the possible range of values for N proves to be 2.86±30%, permitting still lower values for N. Here, for example, a three-by-three matrix of LED chips could be used.

Examples 3 to 6 each pertain to a 0.8-inch light modulator, the width and the length of the cross section of the light receiving region in Examples 3 and 4 being in a mutual ratio of 3:4, whereas in Examples 5 and 6 the ratio is 9:16.

A particularly useful optimization of the system is obtained if the number N is predefined and the size of the LED chips is calculated accordingly from the above relations. For example, assuming a 0.5-inch light modulator with a width-to-length ratio of 3:4, a maximum acceptance angle of 12° and a predefined number of 4 chips, one obtains a chip edge length of 1.06 mm and a chip edge width of 0.8 mm, i.e., chips with a rectangular shape. Taking a predefined number N of 6 LED chips and a maximum acceptance angle of 15°, the results obtained with a light modulator of this kind are, for example, a chip edge length of 1.0 mm and a chip edge width of 0.875 mm.

Each of these examples holds true for n=1, i.e., the LED chips are free of coupling medium. For the case in which the LED chips are provided with a coupling medium comprising a material with a refractive index n=2, the above-calculated lengths and widths of the chips would be only half as great. More efficient, considerably smaller LED chips must be used in this case.

The above table is plotted below for the case in which the lateral faces of the thin-film layer are not neglected, i.e., $A_D$ equals 1.04 mm². Only small differences are obtained in the "Qu. N" values, and this does not influence the results, i.e., the chosen options for N, in this exemplary embodiment.

| | $l_M$ [mm] | $w_M$ [mm] | Qu. N | Qu. X | Qu. y | N | x | y |
|---|---|---|---|---|---|---|---|---|
| 1. | 10.16 | 7.62 | 3.22 | 1.58 | 2.11 | 4 | 2 | 2 |
| 2. | 11.10 | 6.23 | 2.86 | 1.29 | 2.3 | 3 | 1 | 3 |
| 3. | 16.26 | 12.19 | 8.24 | 2.53 | 3.38 | 9 | 3 | 3 |
| 4. | 16.26 | 12.19 | 8.24 | 2.53 | 3.38 | 6 | 2 | 3 |
| 5. | 17.71 | 9.96 | 7.33 | 2.07 | 3.68 | 6 | 2 | 3 |
| 6. | 17.71 | 9.96 | 7.33 | 2.07 | 3.68 | 8 | 2 | 4 |

Figure 10:
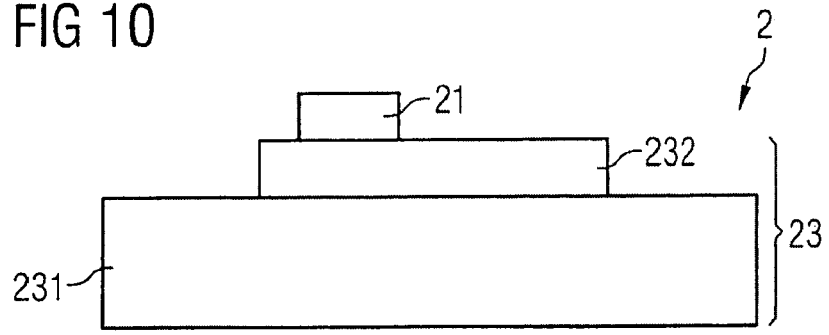
FIG. 10 is a schematic sectional view of the light source according to a second exemplary embodiment.

The light source depicted in FIG. 10 includes at least one LED chip 21, disposed on a carrier 23. The carrier 23 of the light source includes a chip carrier 232, on which the LED chip 21 is mounted for example by soldering. The chip carrier consists, for example, of an electrically insulating material, preferably having a high thermal conductivity. It contains, for example, silicon, aluminum nitride, silicon carbide, boron nitride, surface-oxidized silicon, diamond, plastic/carbon fiber composite, glass/carbon fiber composite and/or glass/diamond particle composite.

The chip carrier 232 is disposed on a thermally conductive substrate 231. The latter comprises or consists of an electrically conductive material, for example. Possible materials are, for example, copper, aluminum, magnesium and/or CMC (a copper/molybdenum/copper layer sequence). The thermally conductive substrate 231 serves as a heat sink for the heat produced by the LED chip 21 when it is operating. The chip carrier 232 consists of a material that is a good thermal conductor, and is preferably bonded directly to the thermally conductive substrate 231.

Formed on the chip carrier 232 are, for example, metallizations, which serve for example to form chip contacting areas and/or conductive traces for contacting the LED chip 21. An electrical connecting side of the LED chip 21 can be electrically conductively connected to the thermally conductive wire 231 so that the latter additionally functions as an electrode.

Figure 19:
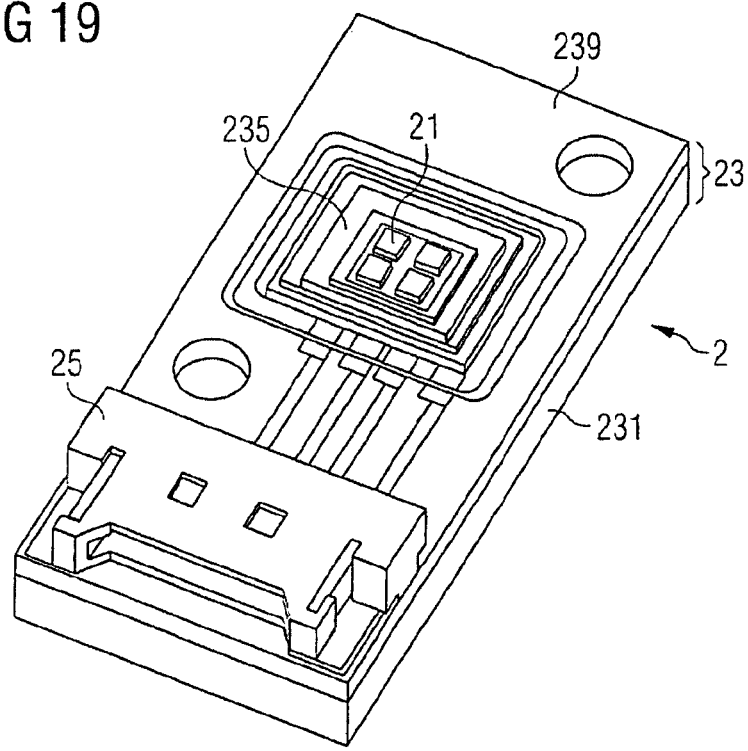
FIG. 19 is a schematic perspective representation of the light source according to a ninth exemplary embodiment.
Figure 20:
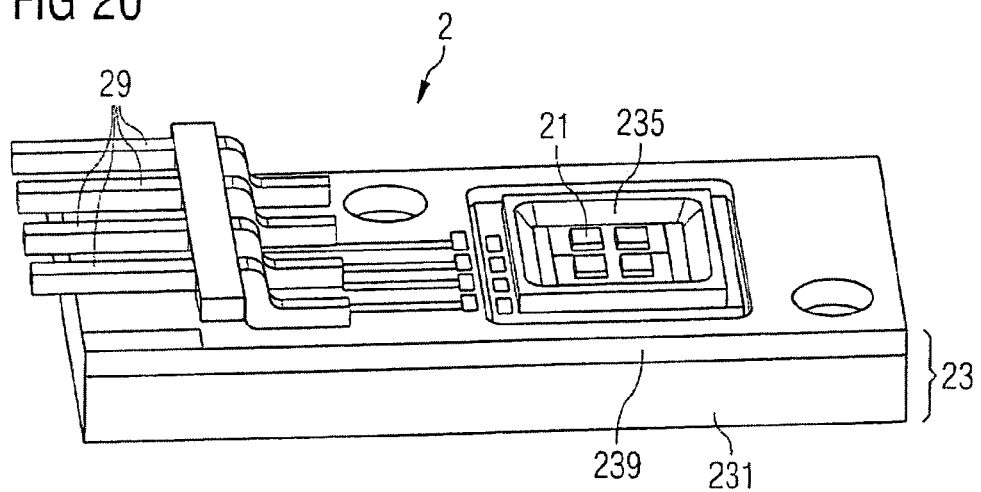
FIG. 20 is a schematic perspective representation of the light source according to a tenth exemplary embodiment.
Figure 21:
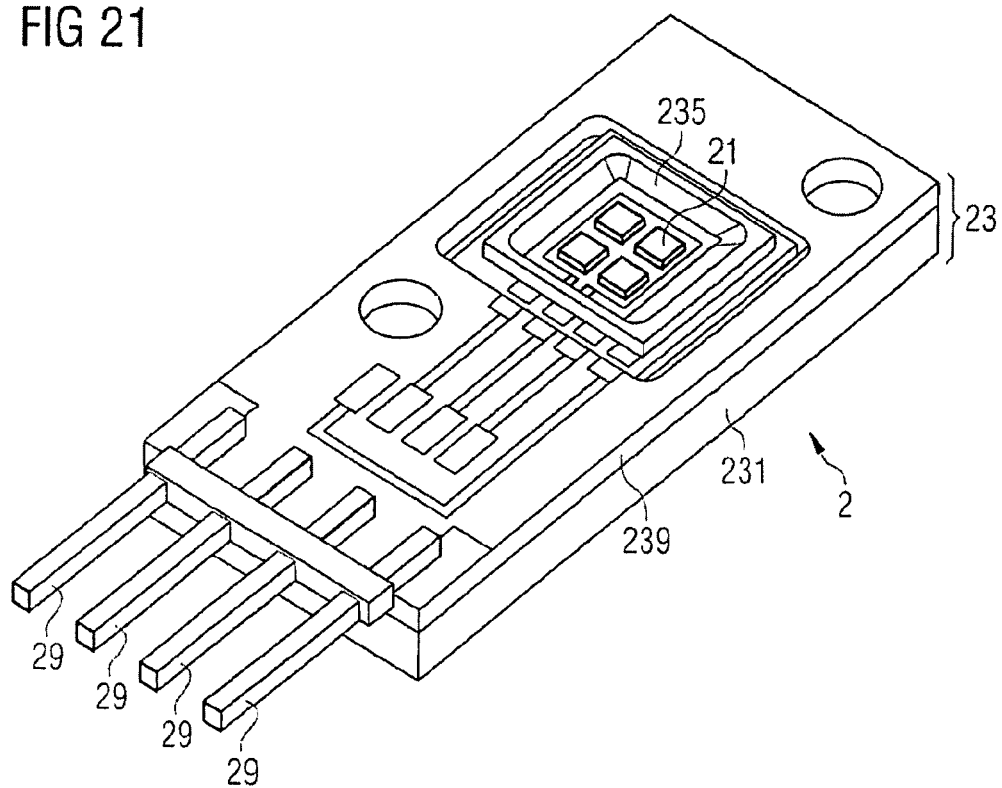
FIG. 21 is a schematic perspective representation of the light source according to an eleventh exemplary embodiment.

Alternatively, the thermally conductive substrate is provided with an electrically insulating layer 239, to which in turn is applied a thin layer of electrically conductive material that is, for example, structured by etching to form conductive traces (see FIGS. 19, 20, 21). The electrically insulating layer and the thin, electrically conductive layer are preferably removed in a region in which the LED chips 21, accompanied by a chip carrier, are mounted directly on the thermally conductive substrate. The heat dissipation and the emission power of the LED chips are significantly increased in this way. A 35% increase in emitted radiation intensity can be achieved, compared to the case in which the chip carrier is placed above the insulating layer. A light source with a structure of this kind is illustrated exemplarily in each of FIGS. 19 to 21.

Figure 11:
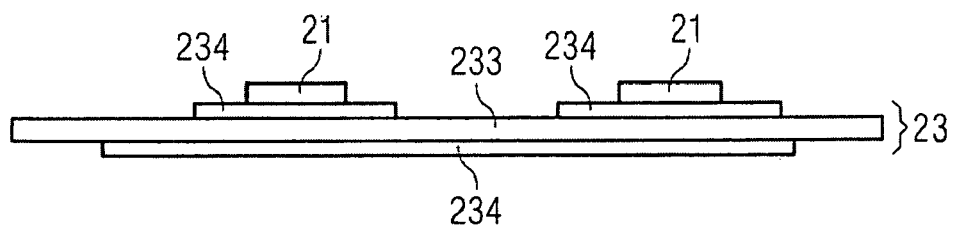
FIG. 11 is a schematic sectional view of the light source according to a third exemplary embodiment.

In the exemplary embodiment depicted in FIG. 11, the light source includes a DCB (direct copper bonding) carrier. This includes a carrier core 233 provided with an electrically conductive jacket 234. The jacket 234 for example comprises or consists of copper. The carrier core 233 preferably consists of an electrically insulating material, so that the electrically conductive jacket is structured and can thus be formed into conductive traces for the light source 2 or LED chips 21.

The carrier core 233 comprises or consists of, for example, at least one of the materials AlN, $Al_2O_3$, SiC, BN, diamond, glass fiber composite, plastic fiber composite, carbon fiber composite and glass diamond composite. Particularly preferred materials for the carrier core 233 are aluminum nitride and/or aluminum oxide.

Figure 12:
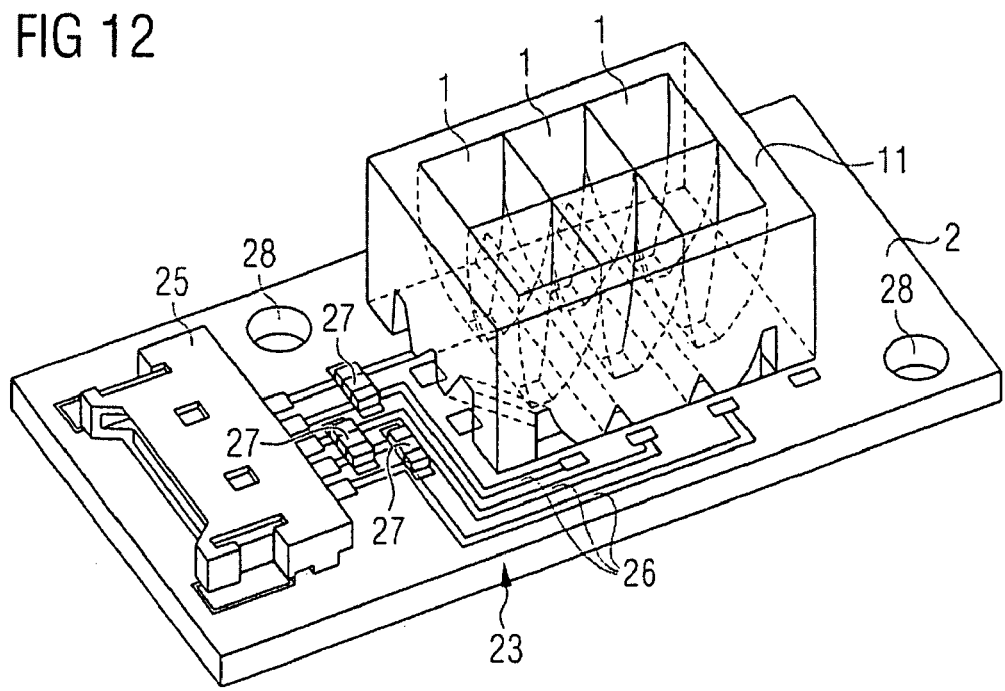
FIG. 12 is a schematic perspective representation of a light source according to a fourth exemplary embodiment and optical elements according to a first exemplary embodiment.

In the structure illustrated in FIG. 12, the light source 2 is configured as a light source module comprising a socket-type connector 25, so that the light source 2 can be electrically connected in a simple manner by means of a mating plug-type connector. The carrier 23 of the light source is, for example, configured as previously described in reference to FIG. 11. The jacket material 234 is formed into electrically conductive traces 26, by means of which the LED chips are electrically conductively connected to the socket-type connector 25.

The electrical circuitry of the light source 2 also includes components 27 that afford protection against electrostatic discharges from the LED chips (ESD protection). These components 27 are, for example, varistors, capacitors or diodes. They are, for example, connected to the LED chips in parallel or in antiparallel (referred to any direction of conduction of the component, e.g. through the diodes). The carrier 23 of the light source 2 also includes mounting holes 28, by means of which the light source module can be mounted mechanically in a technically simple manner, for example with the use of dowel pins and corresponding fixing elements.

Disposed on light source 2 over the LED chips is a plurality of optical elements 1, which for example are configured in one piece with one another. The optical elements 1 are configured in a CPC-like manner and comprise a base body 11 that defines a separate cavity for each optical element 1 and whose inner walls are reflective of the radiation emitted by the light source.

Each LED chip of the light source 2 is, for example, associated with a single optical element 1. A beam input of the optical elements that faces toward the LED chips comprises a radiation input opening whose sides are, for example, ≦1.5 times a corresponding horizontal edge length of the LED chips, preferably ≦1.25 times said edge length. If such a small beam input is disposed is close as possible to the LED chip, any divergence of the radiation emitted by the LED chips can be reduced in an effective manner and a beam cone with a high luminance can be produced.

Figure 13:
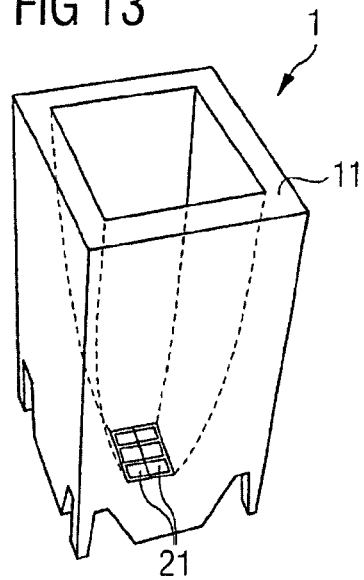
FIG. 13 is a schematic perspective representation of an optical element according to a second exemplary embodiment.
Figure 14:
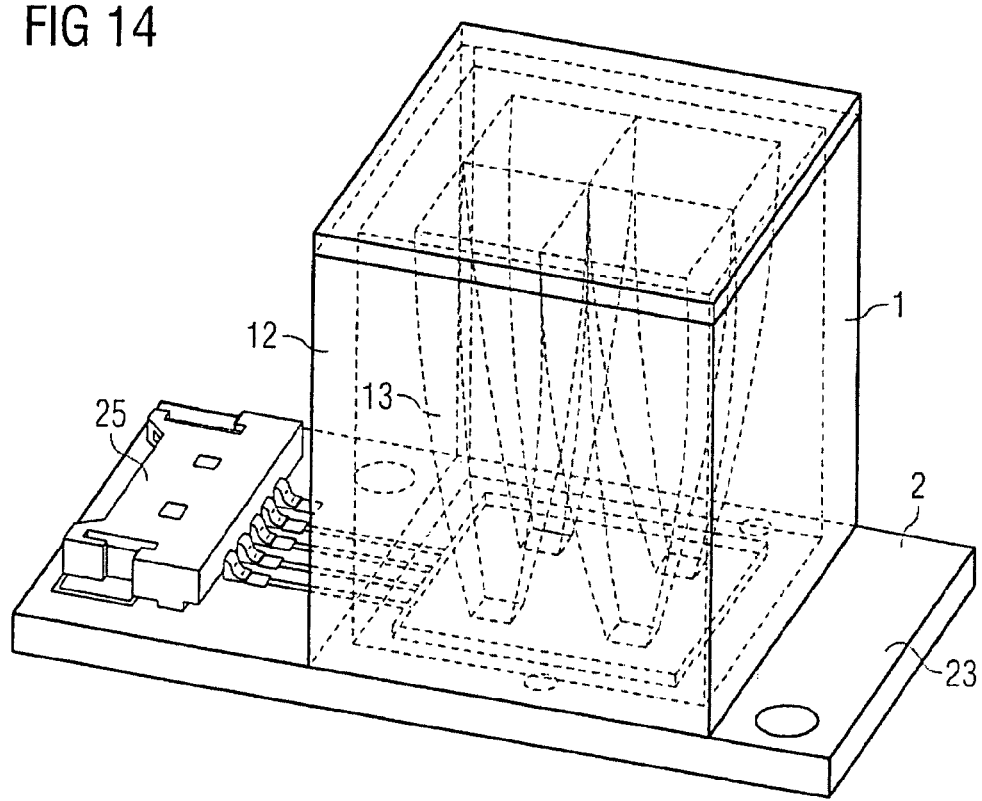
FIG. 14 is a schematic perspective representation of a light source according to a fifth exemplary embodiment and optical elements according to a third exemplary embodiment.

Instead of each LED chip being associated with its own individual optical element 1, the optical element 1 can also be provided for a plurality of LED chips 21, like the optical element 1 depicted in FIG. 13. This is also configured in the manner of a CPC, and comprises a base body 11 that defines a cavity with reflective inner walls. The optical element 1 is provided, for example, for six LED chips 21.

To obtain the highest possible efficiency, the LED chips 21 should be arranged as close together as possible. Neighboring LED chips 21 are, for example, ≦50 μm apart. Particularly preferably, adjacent LED chips have substantially no distance between them.

The beam input and the beam output of the optical element 1 each have, for example, a rectangular shape. The beam input can alternatively have, for example, a substantially square cross section. If such an optical element, provided for a plurality of LED chips, is to be used to obtain the same reduction of divergence as in the case of a plurality of optical elements each associated with a single chip, then it must have a significantly greater length than the plurality of optical elements.

If a light cone emitted by the optical element 1 is intended to have a maximum included angle of θ, this always requires that the concentrator-like optical elements have a certain minimum length that is related to a corresponding dimension (extent) a of the beam input. For an ideal compact parabolic concentrator:

$$l = a/2(l+\sin\theta)\cdot\cos(\theta)/\sin^2(\theta),$$

where l is the minimum length of the optical element 1. For a maximum included angle of 15°, the length of the optical element 1 must be about nine times as great as the length of the beam input. For a maximum included angle of about 9°, this factor is about 23, and for an included angle of 20°, a 5.5-fold length is needed. Depending on the specific implementation of the concentrator, the minimum length l can alternatively be considered an optimal length, in which case it is also possible in particular to undershoot this length, for example by up to 10% or up to 20%.

Thus, the smaller the size of a light input of optical element 1, the smaller the length of the optical element along its optical axis can be to obtain a specific maximum radiation angle for the emitted light cone. If, on the other hand, the optical element is provided for a plurality of LED chips, that is, if it has a correspondingly larger beam input, then the mounting of the optical element in relation to the LED chips is less critical. Particularly preferably, at least two optical elements, each associated with plural LED chips, are provided per light source.

The optical element preferably has a substantially rectangular cross section on the side comprising the beam output. In this way, a cross section of the light cone can be shaped in the optical element so as to at least partially match the cross section of the light receiving region of the light modulator.

According to one exemplary embodiment, the optical element has a beam input with a square cross section. This is provided for a square arrangement of LED chips 23, as illustrated exemplarily in the form of two by two LED chips in each of FIGS. 24 to 27. The cross section of the beam input can alternatively be rectangular, for example.

Figure 33A:
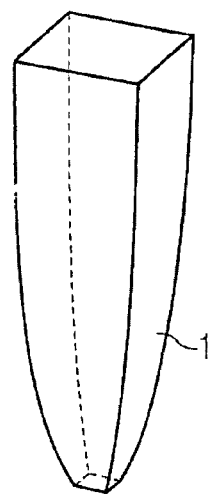
FIG. 33a is a schematic perspective representation of the optical element according to a ninth exemplary embodiment.
Figure 33B:
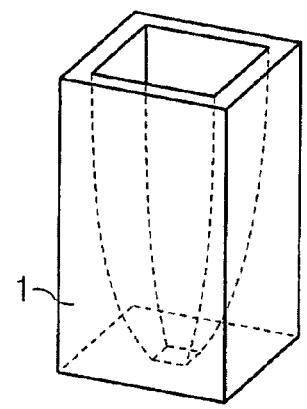
FIG. 33b is a schematic perspective representation of the optical element according to a tenth exemplary embodiment.
Figure 33C:
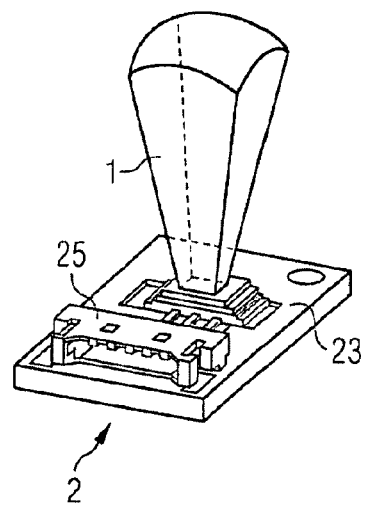
FIG. 33c is a schematic perspective representation of the light source according to a nineteenth exemplary embodiment and the optical element according to an eleventh exemplary embodiment.
Figure 34A:
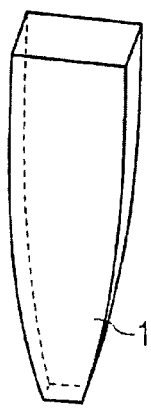
FIG. 34a is a schematic perspective representation of the optical element according to a twelfth exemplary embodiment.
Figure 34B:
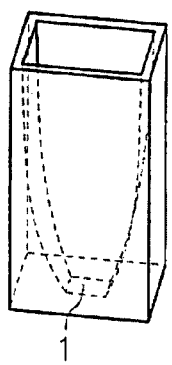
FIG. 34b is a schematic perspective representation of the optical element according to a thirteenth exemplary embodiment.
Figure 34C:
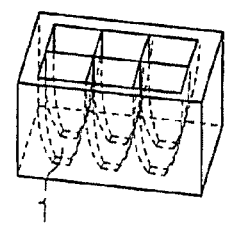
FIG. 34c is a schematic perspective representation of optical elements according to a fourteenth exemplary embodiment.
Figure 34D:
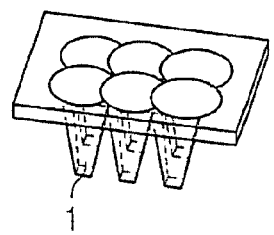
FIG. 34d is a schematic perspective representation of optical elements according to a fifteenth exemplary embodiment.

Additionally or alternatively, the optical element has a first maximum radiation angle of, for example, 11.5° along a first plane and a second maximum radiation angle of, for example, 15.5° along a second plane. To bring this about, the square cross section on the side comprising the beam input can, in progressing to the beam output, change over for example to a rectangular cross section having an extent of, for example, 10 times 7.5 mm. In particular, a first pair of mutually opposite reflective surfaces of the optical element can in this case have a steeper gradient than a second pair of mutually opposite reflective surfaces. The optical elements 1 illustrated in FIG. 16 and FIG. 33B, for example, are configured in this way.

As an alternative to a CPC-like concentrator, the optical element 1 has, for example, side walls that extend in straight lines from the beam input to the beam output. Examples of such optical elements 1 are illustrated in FIGS. 15, 28, 33c and 34d.

The elements in question are either a dielectric concentrator with a truncated-cone-like basic shape or a concentrator with a base body 11 that defines a suitable cavity. In such concentrators, the beam output is preferably provided with a spherical or aspherical lens or is curved outward in the manner of such a lens.

The advantage of an aspherical curvature over a spherical curvature is that the aspherical curvature, for example, decreases with increasing distance from the optical axis of the optical element 1. This gives due consideration to the fact that the beam cone whose divergence is to be reduced by the optical element 1 is not a punctiform light radiation source, but a radiation source that has a given extent.

Such an optical element has the advantage over a CPC-like optical element of yielding a comparable reduction of the divergence of a beam cone while at the same time permitting a significant reduction of the design height of the optical element 1. A further advantage of such optical elements is that their straight side faces can be produced more easily via a molding process, such as injection molding or transfer molding, for example, whereas curved side faces of the kind found in CPC-like concentrators are relatively difficult to create.

In cases where the optical element 1 is configured as a cavity reflector having a base body 11, this base body 11 can be used to fasten it to the light source 2 or position it relative to the light source 2. Exemplary embodiments in which the optical element is configured as a cavity reflector are illustrated in FIGS. 12, 13, 33b, 34b and 34c.

If, on the other hand, the optical element 1 is configured in the manner of a dielectric concentrator, additional fastening devices are usually needed to position the optical element 1 on the light source 2 or relative to the light source 2. Examples of optical elements configured in the manner of a dielectric concentrator are illustrated in FIGS. 14 to 17, 23, 28, 33a, 33c, 34a and 34d.

The optical elements illustrated in FIGS. 23, 28 and 14 to 16 comprise retaining elements 12, which extend away from the dielectric base body 13 in the vicinity of the beam output of the optical element or elements 1 and project laterally away therefrom, and proceed toward the beam input at a distance from the base body 13.

Figure 15:
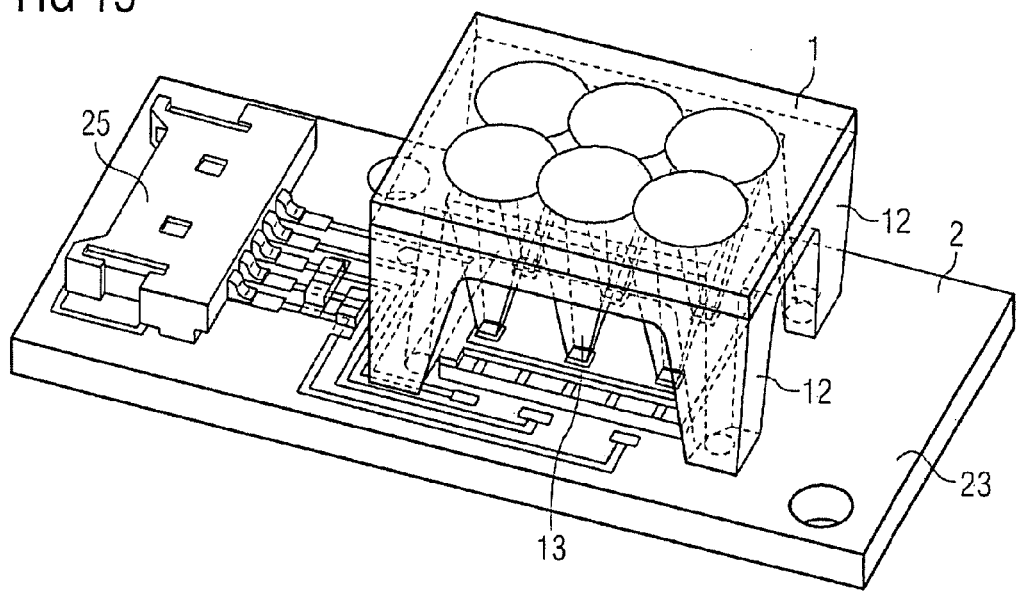
FIG. 15 is a schematic perspective representation of a light source according to a sixth exemplary embodiment and optical elements according to a fourth exemplary embodiment.
Figure 16:
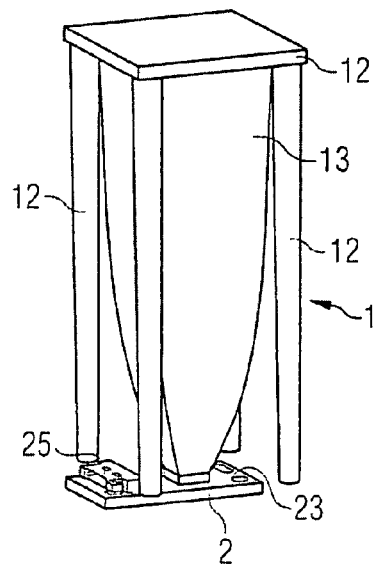
FIG. 16 is a schematic perspective representation of a light source according to a seventh exemplary embodiment and optical elements according to a fifth exemplary embodiment.
Figure 17:
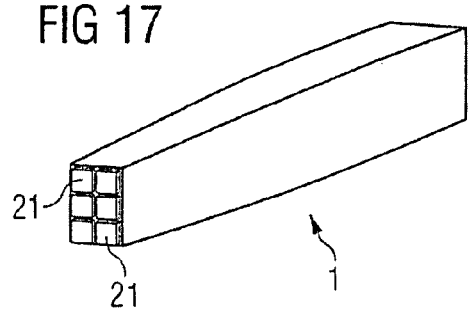
FIG. 17 is a schematic perspective representation of the optical element according to a sixth exemplary embodiment.
Figure 18:
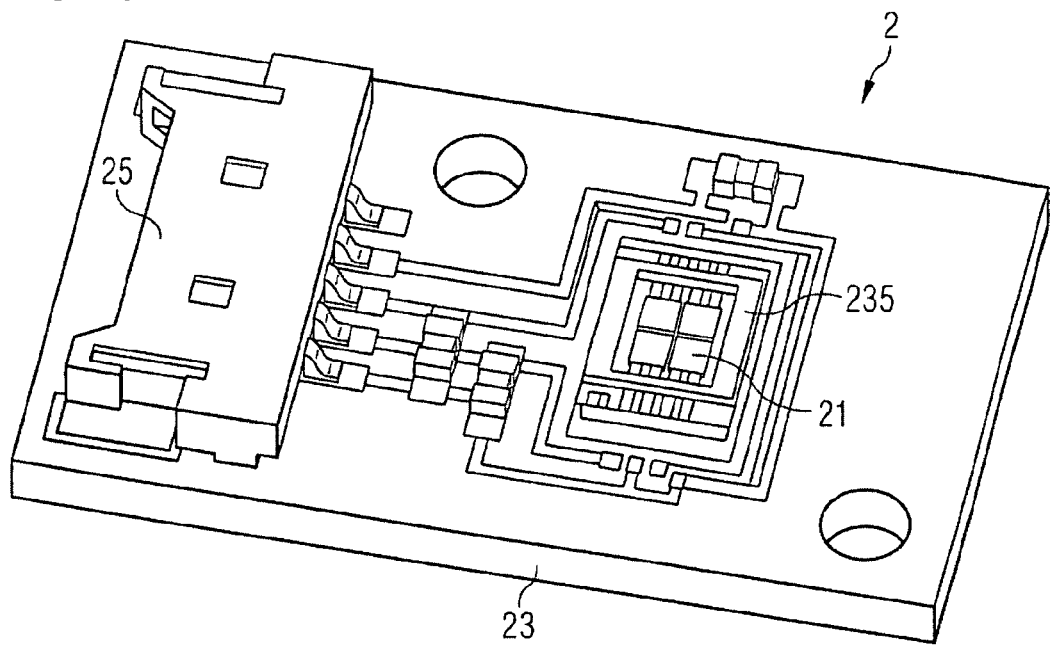
FIG. 18 is a schematic perspective representation of the light source according to an eighth exemplary embodiment.

The retaining elements 12 can include, for example, column-like elements on which the optical elements can be placed and thereby positioned relative to the light source 2 (see FIGS. 15 and 16, for example). Alternatively, the retaining elements 12 can also comprise wall-like uprights that at least partially enclose the optical elements laterally (see FIGS. 14 and 23, for example).

As an alternative to the retaining elements 12, the optical elements 1 can also be mounted and positioned by means of separate retaining devices. For example, they can be inserted in a separate frame.

The LED chips are, for example, mounted in chip housings 235, as illustrated exemplarily in FIGS. 29 to 32. The chip housings 235 are, for example, mounted on the carrier 23 and the light source 2, or they themselves form a light source 2, which can be contacted electrically conductively and emits electromagnetic radiation in operation. Examples of light sources 2 in which one or more chip housings 235 are mounted on the carrier 23 are illustrated in FIGS. 18 to 28.

The chip housing 235 includes a chip carrier 232 and a housing frame 236. The chip carrier 232 comprises metallizations that form at least one, preferably a plurality of chip connection regions 237 and electrical conductive traces 238. The chip carrier 232 is free of frame material on two mutually opposite sides, so that the conductive traces 238 are accessible at these locations and can thus be electrically conductively contacted.

One option is for the chip housing 235 to be monolithically formed, so that the housing frame 236 and the chip carrier 232 are formed into a "single-storey" element. This is possible, for example, with the use of a ceramic as the material for the chip housing, if the frame 236 is placed on the chip carrier 232 before the ceramic material is fired and thus hardened. During the subsequent firing process, the frame 236 and the chip carrier 232 bond together into a common part. This can be promoted by pressing the two parts together in the unfired state.

Alternatively, the chip carrier 232 and the frame 236 are each separately configured. In this case, the housing frame 236 is, for example, glued onto the chip carrier 232.

The chip carrier 232 and/or the housing frame 236 contain, for example, aluminum nitride, aluminum oxide, glass ceramic, glass and/or metal. The frame can consist of a synthetic material or contain a synthetic material that has a similar thermal expansion coefficient to a material of the chip carrier 232, and is preferably coated with a material that is a good reflector. In principle, the frame is preferably white pigmented or is coated with a white or other reflective material.

The chip contacting regions 237 and the conductive traces 238 are formed, for example, of metal coatings, for example of gold coatings. This is the case, for example, with the chip housings illustrated in FIGS. 29 and 32.

Figure 30:
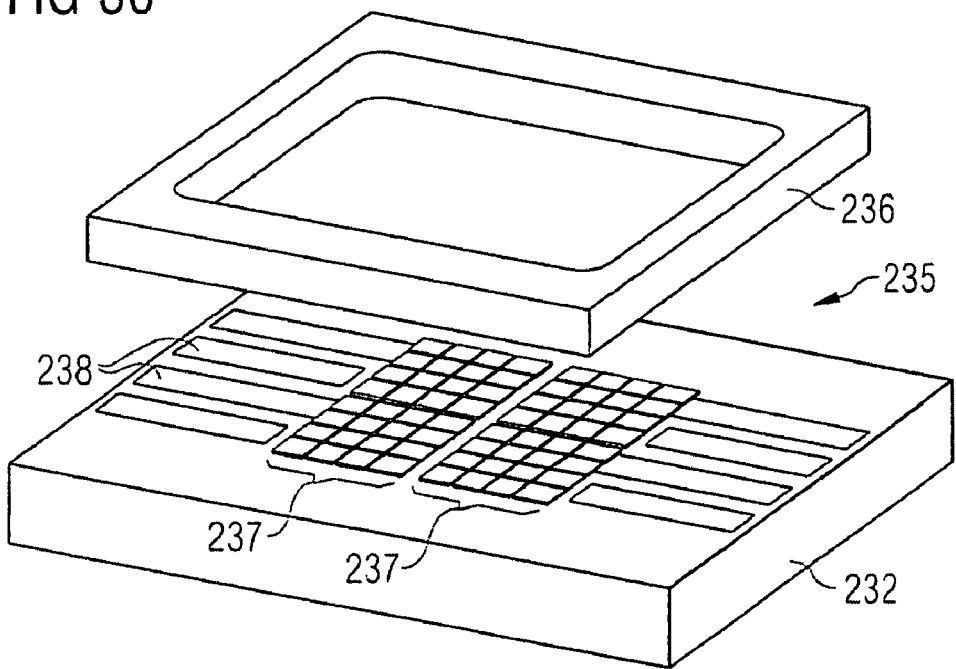
FIG. 30 is a schematic perspective representation of a housing for the light source according to a second exemplary embodiment.

The chip housing 235 illustrated in FIG. 30 has chip contacting regions 237 formed from a solder. For example, each of the chip contacting regions is defined by a plurality of small solder bumps.

The conductive traces 238 comprise or consist of aluminum, for example. This has the advantage that aluminum functions as a solder stop for the solder of the chip contacting regions 237.

Figure 31:
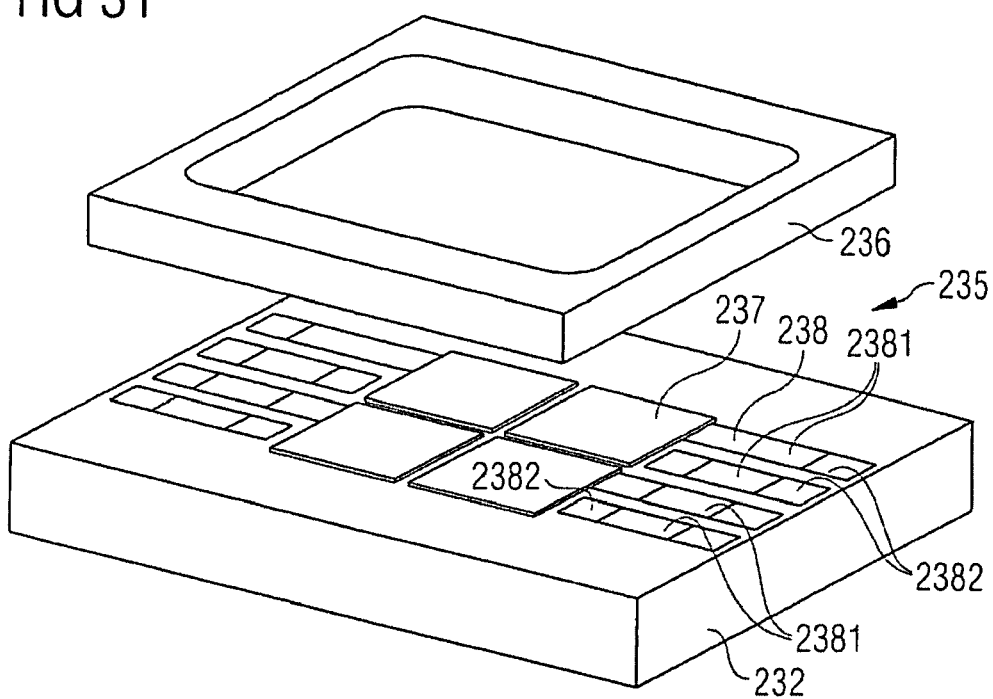
FIG. 31 is a schematic perspective representation of a housing for the light source according to a third exemplary embodiment.
Figure 32:
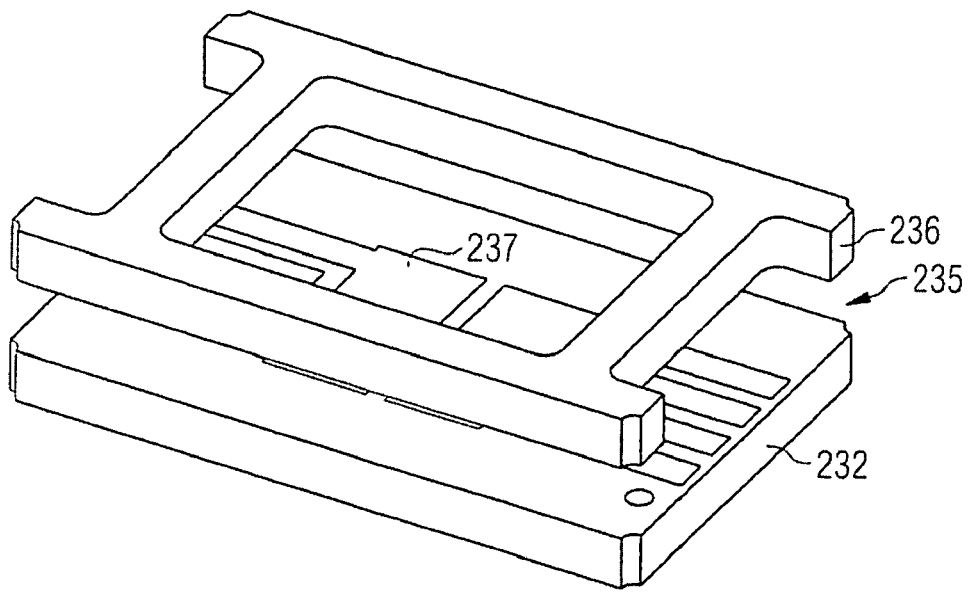
FIG. 32 is a schematic perspective representation of a housing for the light source according to a fourth exemplary embodiment.

The chip housing 235 illustrated in FIG. 31 comprises conductive traces 238 with portions that are formed from different materials. First portions 2381 comprise aluminum, for example, which can function as a solder stop, and second portions 2382 comprise another metal, for example gold. First portions 2381 can, for example, serve to reduce the risk of short circuits. In addition, the solder stop can keep solder provided for mounting the LED chips from moistening the conductive paths and thereby, for example, damaging or detaching gold contacts.

The housing frame is suitable for providing the LED chips mounted in the chip housing 235 with a potting compound. To this end, the inner region of the chip frame is, for example, at least partially filled with a potting compound. The potting compound serves, for one thing, to encapsulate the LED chips 21 and thereby protect them against external influences. Additionally or alternatively, however, the compound can also serve as a matrix material for one or more phosphors, such that the potting compound forms a luminescence conversion element. Alternatively, the luminescence conversion element can be applied in a thin layer directly to the radiation decoupling area of the LED chip.

It is preferably provided that different LED chips of a light source are provided with different luminescence conversion elements, that is, the luminescence conversion elements comprise different phosphors or phosphor mixtures. For example, of four luminescence diode chips 21, one is provided with a blue-emitting phosphor, one a red-emitting phosphor and two a green-emitting phosphor, said green-emitting phosphor optionally being the same in both cases. Instead of a blue-emitting phosphor, it is also possible to use a blue-emitting LED that is not provided with a luminescence conversion material.

When phosphors are used, it is possible to employ LED chips that emit electromagnetic radiation whose wavelengths are at least partially outside the visible spectrum. For example, the LED chips are based on AlInGaN and in operation emit electromagnetic radiation from the ultraviolet region.

All converters known for use with LEDs are suitable as luminescence conversion elements. Examples of such phosphors and phosphor mixtures that are suitable as converters are:

chlorosilicates, as disclosed for example in DE 10036940 and the prior art described therein, orthosilicates, sulfides, thiometals and vanadates, as disclosed for example in WO 2000/33390 and the prior art described therein, aluminates, oxides, halophosphates, as disclosed for example in U.S. Pat. No. 6,616,862 and the prior art described therein, nitrides, sions and sialons, as disclosed for example in DE 10147040 and the prior art described therein, and rare earth garmets, such as YAG:Ce and the alkaline earth elements, as disclosed for example in US 2004-062699 and the prior art described therein.

Figure 22B:
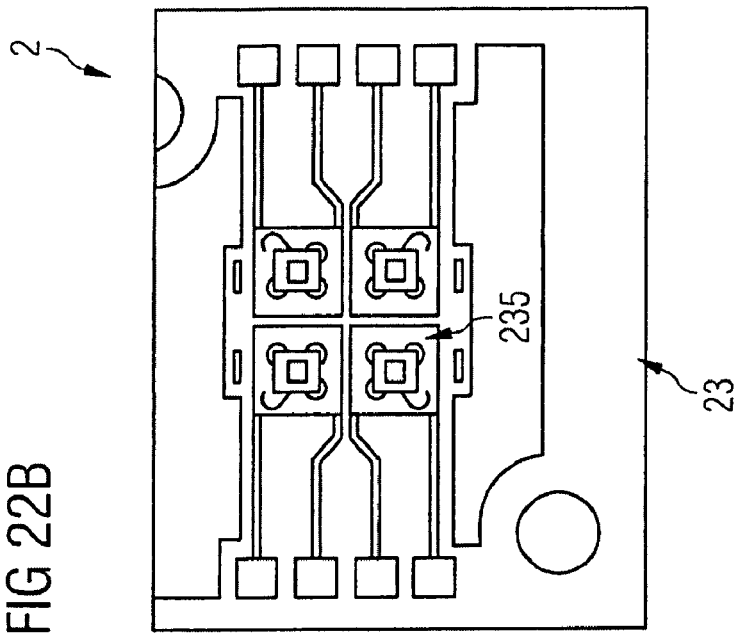
FIG. 22b is a plan view of the light source depicted in FIG. 22a, FIG. 23 is a schematic perspective representation of the light source according to a thirteenth exemplary embodiment and optical elements according to a seventh exemplary embodiment.
Figure 22A:
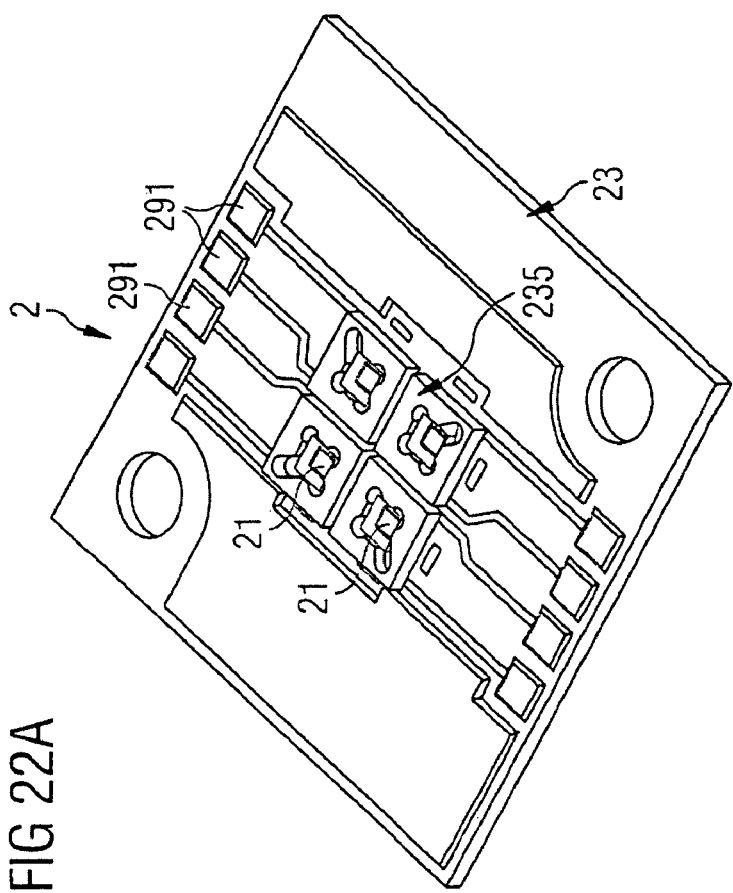
FIG. 22a is a schematic perspective representation of the light source according to a twelfth exemplary embodiment.
Figure 23:
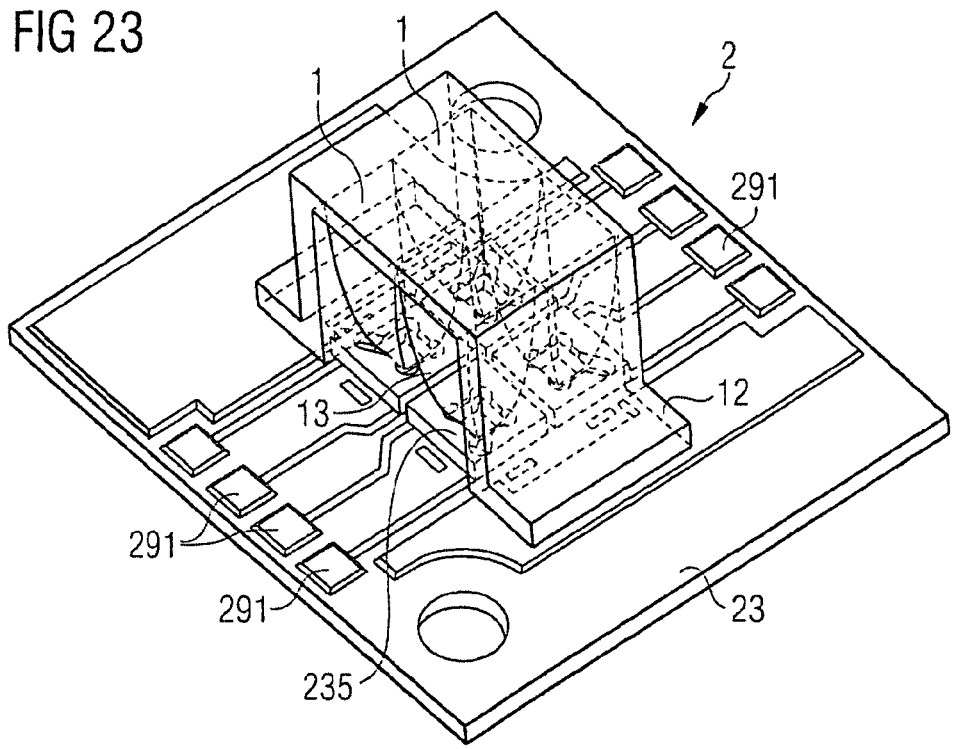
Figure 24:
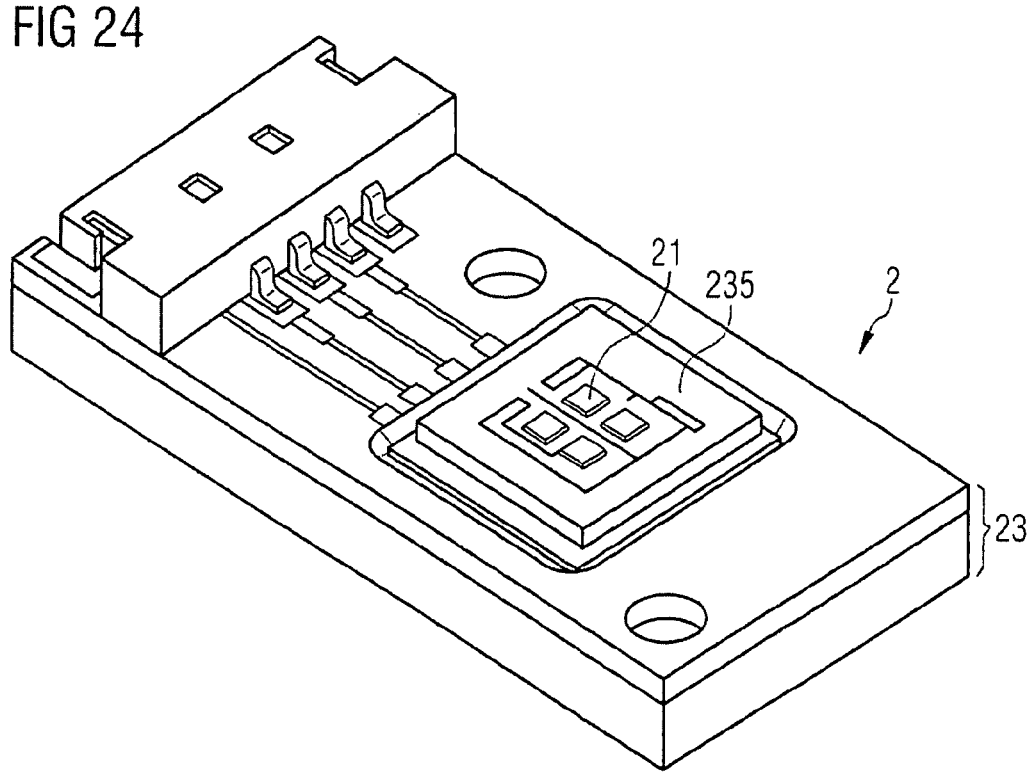
FIG. 24 is a schematic perspective representation of the light source according to a fourteenth exemplary embodiment.
Figure 25:
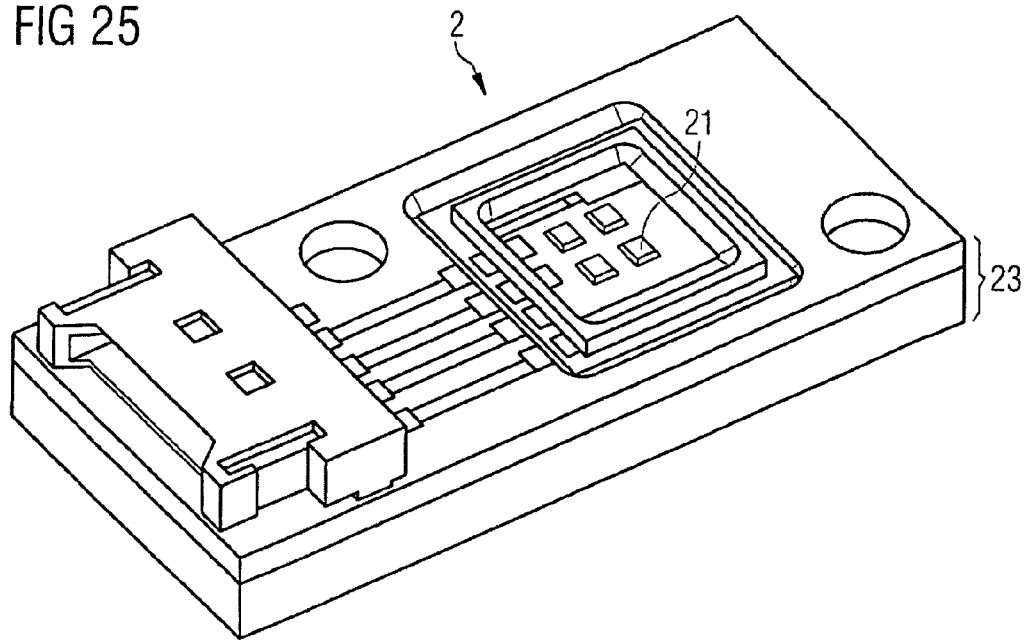
FIG. 25 is a schematic perspective representation of the light source according to a fifteenth exemplary embodiment.
Figure 26:
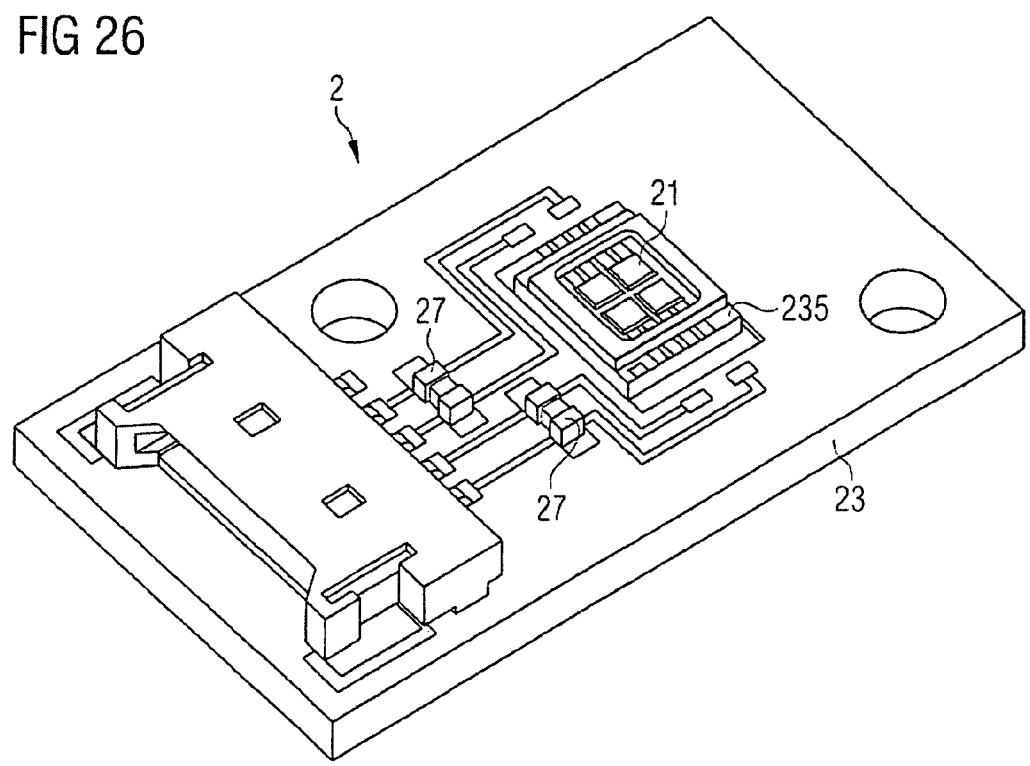
FIG. 26 is a schematic perspective representation of the light source according to a sixteenth exemplary embodiment.
Figure 27:
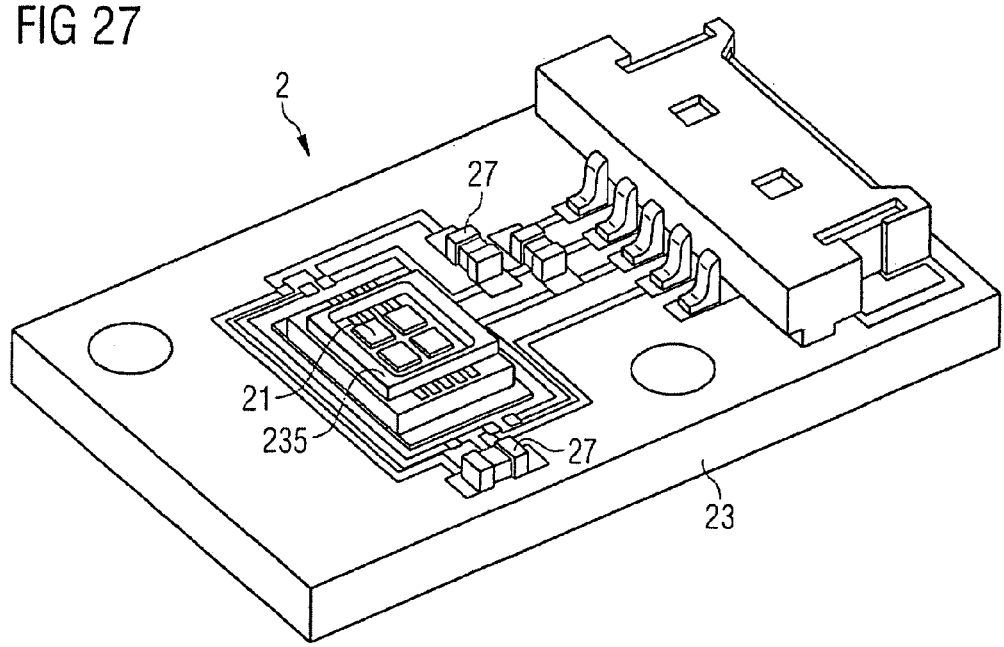
FIG. 27 is a schematic perspective representation of the light source according to a seventeenth exemplary embodiment.
Figure 28:
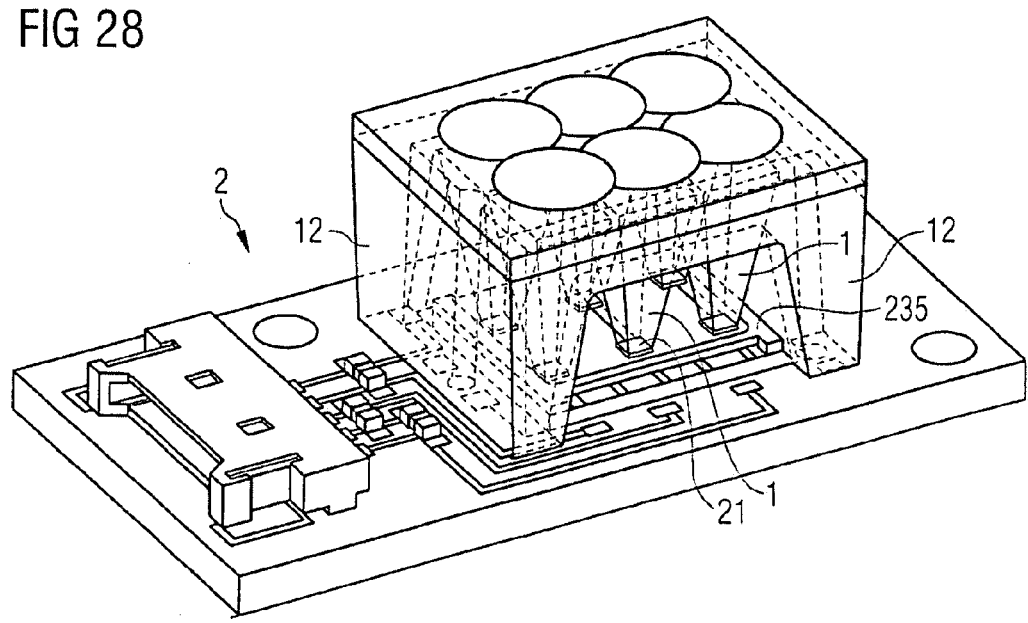
FIG. 28 is a perspective schematic representation of the light source according to an eighteenth exemplary embodiment and optical elements according to an eighth exemplary embodiment.
Figure 29:
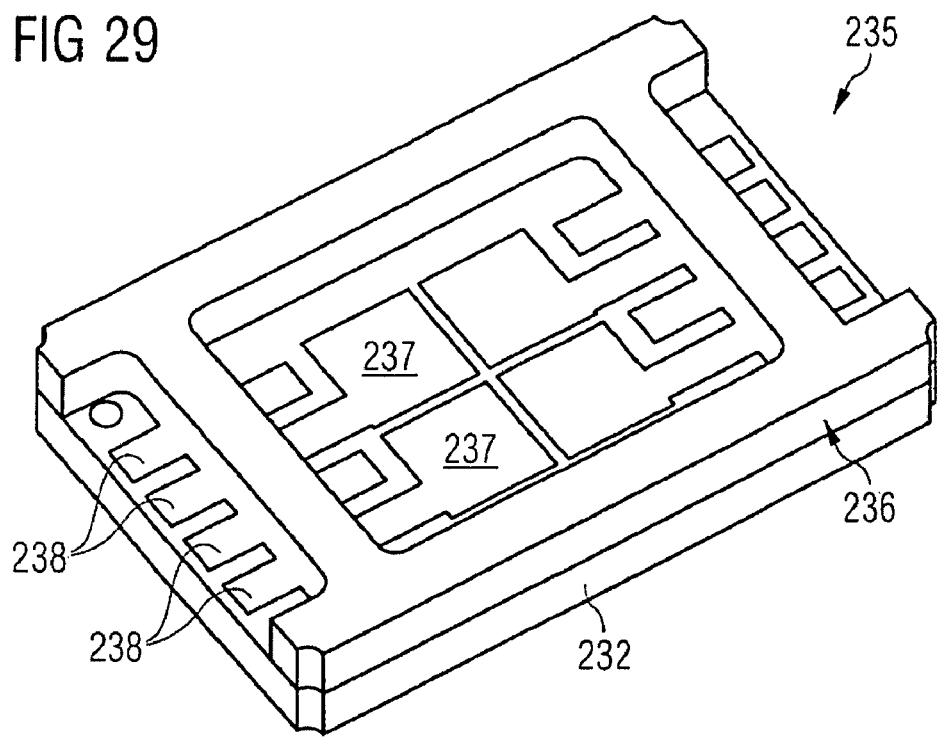
FIG. 29 is a schematic perspective representation of a housing for the light source according to a first exemplary embodiment.

The light sources 2 illustrated in FIGS. 22a to 23 comprise, for example, LED chips 21 that are encapsulated in the above-described manner. The housing frames of the chip housing 235 illustrated in these figures each comprise a recess shaped in such a way that they serve as alignment aids for lining up the optical element 1 over the LED chips 21.

The recess in each of the chip frames has a square or rectangular basic shape, a round, for example circular, shape being superimposed on the corners of the square or rectangle so that edges of the optical elements 1 can be inserted in the housing frames in a technically simple manner and are guided in that process by the round enlargements of the recesses.

The optical element 1 can alternatively be configured as a light guide having a constant cross-sectional area, as illustrated in FIG. 38, or having a cross-sectional area that increases to the light output, as illustrated in FIG. 37. The light guide serves to mix light from the light source 2 and results in a uniformly illuminated light cone, particularly if the light source comprises LED chips 21 that emit differently colored light and/or luminescence conversion elements that emit differently colored light.

It is particularly advantageous if the beam output from the light guide is imaged, for example by means of a projection lens, since at that point the light cone has undergone substantial intermixing by the light guide. Conversely, increased demixing of the light cone may be observed with increasing distance from the light guide.

The light guide has, for example, a cross section in the shape of an even-numbered polygon. In particular, it comprises straight subareas that extend rectilinearly from a light input to a light output. A light guide can also be provided with retaining elements 12, which extend laterally away from the base body on the side comprising the light output and proceed toward the light input at a distance from the base body, in a bracket-like implementation. The base body and the retaining elements 12 are preferably formed from one and the same material, and particularly preferably as a "single-storey" element.

FIG. 40 shows the influence of the retaining elements 12 on radiation emissions from the light guide. The luminous intensity distribution is plotted as a function of distance from the optical axis of the light guide, the continuous line representing a measurement of the radiation intensity in a beam path behind the light guide without retaining elements, as illustrated for example in FIG. 37, and the broken line reflecting a measurement of illuminance using a light guide with retaining elements 12, as illustrated in FIG. 39. The curves show no significant influence of the retaining elements 12 on the decoupling of radiation from the light guides used for mixing.

Figure 35:
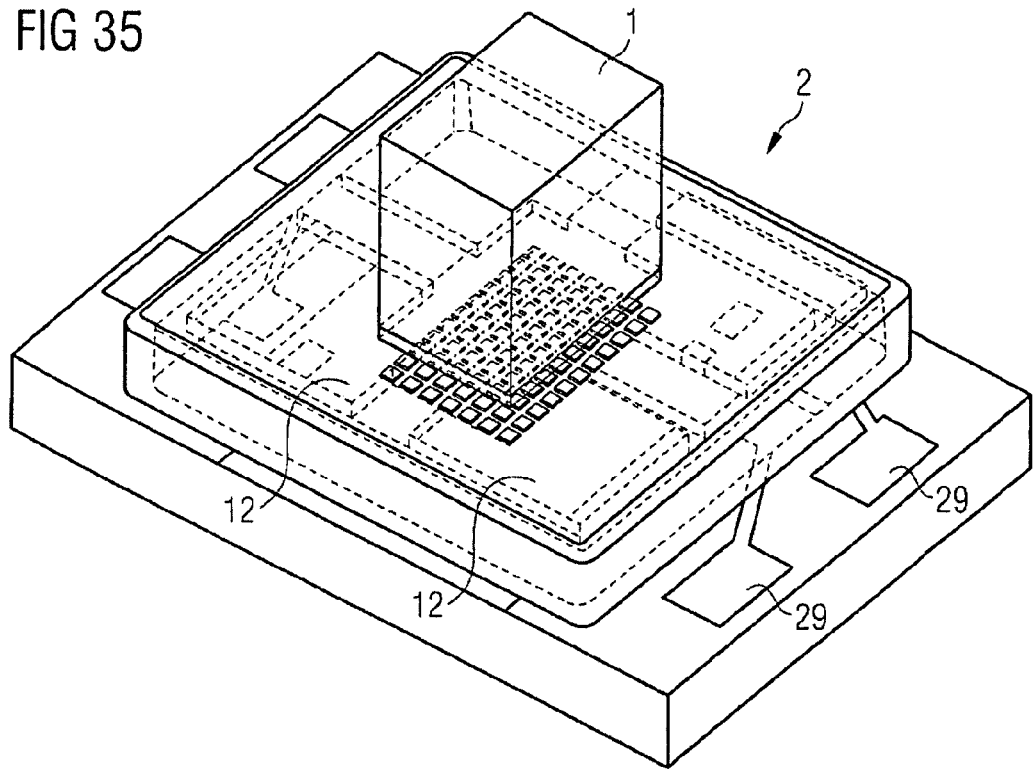
FIG. 35 is a schematic perspective representation of the light source according to a twentieth exemplary embodiment and the optical element according to a sixteenth exemplary embodiment.
Figure 36:
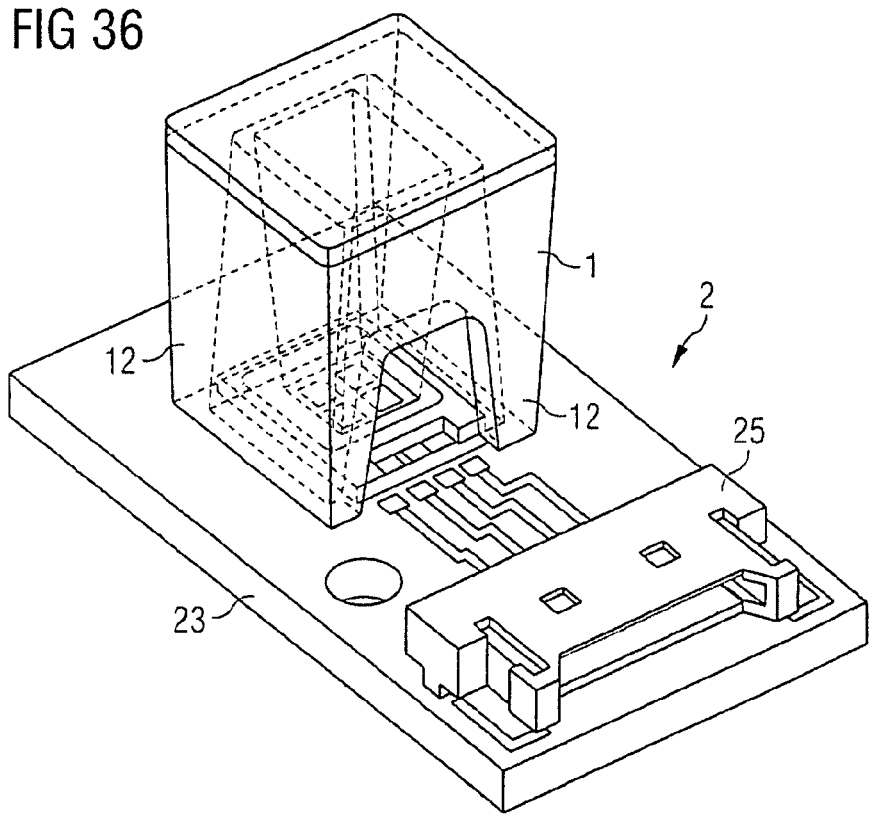
FIG. 36 is a schematic perspective representation of the light source according to a twenty-first exemplary embodiment and the optical element according to a seventeenth exemplary embodiment.

A mixer with retaining elements is also illustrated in FIG. 36. In the exemplary embodiment illustrated in FIG. 35, the light guide 1 has a die-like shape. In this optical element, retaining elements extend away from the base body of the light guide in the vicinity of the light input, in contrast to the previously discussed examples.

Whereas the light sources 2 illustrated in FIGS. 14 to 16, 18, 19, 28, 33c and 36 comprise socket-type connectors 25 for electrically connecting the light sources by means of a corresponding plug-type connector, the light sources 2 shown in FIGS. 20 and 21 instead comprise a plurality of electrical contact pins 29, which also, however, are suitable for electrically connecting the light source 2 to one or more mating plug-type connectors.

A further variant is illustrated in FIGS. 22a to 23 and 35. In the case of the light sources 2 depicted in these figures, it is provided to electrically conductively connect them via electrical contact surfaces 291. This is done by soldering, for example.

The various features and elements described in this application are not limited to use in a projection apparatus, although they work together synergistically particularly in a projection apparatus. Each of said features and elements can constitute a separate invention in and of itself and is suitable for uses in various other fields. For instance, the light sources 2 can also be used for projection lamp applications or for general lighting. The optical elements can, as such, be inventions in and of themselves and be used for different purposes. The same is true of the arrangement and use of luminescence conversion elements or the structure of the carrier for the light sources, the chip housing, the arrangement of LED chips in the light source, or the arrangement of the optical elements.

Possible combinations of features are also not limited by the description of the exemplary embodiments to the combinations specified therein. The invention encompasses any novel feature and any combination of features, including in particular any combination of features recited in the claims, even if that feature or combination itself is not explicitly mentioned in the claims or exemplary embodiments.

The invention claimed is:

1. A projection apparatus with a light modulator having a light receiving region with a cross-sectional area to be illuminated of the size $A_M$ and a maximum acceptance angle $\alpha$ for incident light, and at least one light source by means of which, during its operation, a light cone is produced for illuminating said cross-sectional area of said light receiving region and which comprises a number N of LED chips having a radiation decoupling area of the size $A_D$ and a maximum radiation angle $\beta$, characterized in that
at least one optical element is disposed in a light path between said LED chips and said light modulator,
a gap filled with a gas is present in the light path between said LED chips and said optical element, and
$0.7 \cdot (A_M \cdot \sin^2(\alpha))/(A_D \cdot \sin^2(\beta) \cdot n^2) \leq N \leq 1.3 \cdot (A_M \cdot \sin^2(\alpha))/(A_D \cdot \sin^2(\beta) \cdot n^2)$, where if said radiation decoupling area $A_D$ of said LED chips is free of a coupling medium, then n=1, and if said radiation decoupling area $A_D$ of said LED chips is provided with a coupling medium, then n is equal to the refractive index of a material of the coupling medium.

2. The projection apparatus as recited in claim 1, wherein said radiation decoupling area $A_D$ of said LED chips is provided with the coupling medium.

3. The projection apparatus as in claim 1, wherein said LED chips comprise a thin-film layer having an electromagnetic radiation emitting active region that is substantially free of growth substrate and is provided with a reflector on a side facing away from a main radiation area.

4. The projection apparatus as in claim 3, wherein the cross-sectional area $A_M$ of said light receiving region of said light modulator has a length $l_M$ and a width $w_M$, the main radiation area of said thin-film layer has a length $l_D$ and a width $w_D$, and wherein said LED chips are arranged in a matrix having x rows and y columns, where $0.7 \cdot (l_M \cdot \sin(\alpha))/(l_D \cdot \sin(\beta) \cdot n) \leq x \leq 1.3 \cdot (l_M \cdot \sin(\alpha))/(l_D \cdot \sin(\beta) \cdot n)$ and $0.7 \cdot (w_M \cdot \sin(\alpha))/(w_D \cdot \sin(\beta) \cdot n) \leq y \leq 1.3 \cdot (w_M \cdot \sin(\alpha))/(w_D \cdot \sin(\beta) \cdot n)$.

5. The projection apparatus as in claim 4, wherein possible values for the number N and for the number x or y are respectively equal to the corresponding quotient $(A_M \cdot \sin^2(\alpha))/(A_D \cdot \sin^2(\beta) \cdot n^2)$, $(l_M \cdot \sin(\alpha))/(l_D \cdot \sin(\beta) \cdot n)$ or $(w_M \cdot \sin(\alpha))/(w_D \cdot \sin(\beta) \cdot n)$, rounded up or down to a neighboring whole number.

6. The projection apparatus as in claim 5, wherein possible values for the number N and for the number x or y are respectively equal to the corresponding quotient, rounded up to a neighboring even number.

7. The projection apparatus as in claim 1, wherein a main radiation area of said LED chips has a substantially rectangular shape.

8. The projection apparatus as in claim 1, wherein plural ones of said LED chips collectively are associated with one optical element.

9. The projection apparatus as in claim 1, wherein said LED chips are divided into at least two groups, each of which is associated with its own optical element.

10. The projection apparatus as in claim 1, wherein at least some of said LED chips are followed by a luminescence conversion element.

11. The projection apparatus as in claim 10, wherein different ones of said LED chips of said light source are followed by different luminescence conversion materials.

12. The projection apparatus as in claim 1, wherein said optical element is configured in the manner of a non-imaging optical concentrator, which is provided for radiation to pass through it in the opposite direction from that taken in a conventional use of a concentrator.

13. The projection apparatus as in claim 12, wherein said optical element is a CPC-, CEC- or CHC-like concentrator.

14. The projection apparatus as in claim 12, wherein reflective surfaces of said optical element are configured partially or completely as free-form surfaces.

15. The projection apparatus as in claim 12, wherein said optical element has side walls that connect a radiation input to a radiation output and are configured such that direct connecting lines extending on said side walls between said radiation input and said radiation output run substantially rectilinearly.

16. The projection apparatus as in claim 12, wherein said optical element has a base body that defines a cavity and whose inner wall is reflective of at least a spectral subregion of the light emitted by said light source.

17. The projection apparatus as in claim 12, wherein said optical element is configured in the manner of a dielectric concentrator whose base body is a solid body comprising a dielectric material of suitable refractive index, such that light coupled into said optical element is reflected by total reflection into the surrounding medium from lateral boundary surfaces of said solid body that connect said radiation input to said radiation output.

18. The projection apparatus as in claim 12, wherein said optical element comprises a radiation output having a boundary surface that is curved in a lens-like manner.

19. The projection apparatus as in claim 1, wherein said optical element is configured as a light guide operative to mix light and having a constant cross-sectional area or a cross-sectional area that increases in the direction of said light output, or at least one such light guide is disposed in the beam path after said optical element.

20. The projection apparatus as in claim 1, wherein said optical element is configured as a light guide operative to mix light and having a cross-sectional area that decreases in size toward said light output, or at least one such light guide is disposed in the beam path after said optical element.

21. The projection apparatus as in claim 1, wherein some mutually adjacent LED chips or all mutually adjacent LED chips have a spacing between them of less than or equal to 300 µm and greater than or equal to 0 µm.

22. The projection apparatus as in claim 1, wherein some mutually adjacent LED chips or all mutually adjacent LED chips have a spacing between them of less than or equal to 100 µm and greater than or equal to 0 µm.

23. The projection apparatus as in claim 1, wherein said optical element has a substantially rectangular cross section on a side where it comprises a beam output.

24. The projection apparatus as in claim 1, wherein said optical element has a first maximum radiation angle along a first plane and a second maximum radiation different from said first maximum radiation angle along a second plane.

25. The projection apparatus as in claim 24, wherein said first maximum radiation angle is between 10° inclusive and 13° inclusive and said second maximum radiation angle is between 13° inclusive and 18° inclusive.

26. The projection apparatus as in claim 1, wherein said radiation decoupling area $A_D$ of said LED chips is free of the coupling medium.

* * * * *